(12) United States Patent
Li et al.

(10) Patent No.: US 11,687,203 B2
(45) Date of Patent: Jun. 27, 2023

(54) TOUCH DISPLAY DEVICE, TOUCH DISPLAY PANEL, TOUCH MODULE AND FORMATION METHOD THEREOF

(71) Applicant: Shanghai Tianma Micro-Electronics Co., Ltd., Shanghai (CN)

(72) Inventors: Haiquan Li, Shanghai (CN); Yimiao Ding, Shanghai (CN); Jun Zhou, Shanghai (CN); Lihua Wang, Shanghai (CN); Shanshan Zhang, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 17/446,910

(22) Filed: Sep. 3, 2021

(65) Prior Publication Data

US 2022/0382414 A1 Dec. 1, 2022

(30) Foreign Application Priority Data

May 28, 2021 (CN) .......................... 202110589512.6

(51) Int. Cl.
*G06F 3/044* (2006.01)
*G06F 3/041* (2006.01)

(52) U.S. Cl.
CPC .......... *G06F 3/0446* (2019.05); *G06F 3/0412* (2013.01); *G06F 3/0443* (2019.05); *G06F 2203/04103* (2013.01); *G06F 2203/04111* (2013.01)

(58) Field of Classification Search
None
See application file for complete search history.

(56) References Cited

U.S. PATENT DOCUMENTS

| | | | | |
|---|---|---|---|---|
| 2013/0105294 | A1* | 5/2013 | Ye | C09K 19/02 200/600 |
| 2016/0018930 | A1* | 1/2016 | Lee | G06F 3/047 345/174 |
| 2019/0243486 | A1* | 8/2019 | Zhang | G06F 3/0412 |
| 2019/0294273 | A1* | 9/2019 | Yoshida | G06F 3/0418 |
| 2020/0210009 | A1* | 7/2020 | Kim | G06F 3/0443 |

FOREIGN PATENT DOCUMENTS

| | | |
|---|---|---|
| CN | 103793098 B | 9/2017 |
| CN | 109426389 A | 3/2019 |
| CN | 111399701 A | 7/2020 |

* cited by examiner

*Primary Examiner* — Duane N Taylor, Jr.
(74) *Attorney, Agent, or Firm* — Anova Law Group PLLC

(57) ABSTRACT

Touch display device, touch display panel, touch module and forming method thereof are provided. The touch module includes a substrate, and a first shadow elimination layer, a touch electrode layer, a second shadow elimination layer, and a bridge layer that are sequentially located on a side of the substrate. The touch electrode layer includes a plurality of first touch electrodes. The bridge layer includes a plurality of bridges, and a bridge of the plurality of bridges connects two adjacent first touch electrodes through a via passing through the second shadow elimination layer.

23 Claims, 16 Drawing Sheets

TOUCH DISPLAY DEVICE, TOUCH DISPLAY PANEL, TOUCH MODULE AND FORMATION METHOD THEREOF

CROSS-REFERENCE TO RELATED APPLICATION

This application claims priority of Chinese Patent Application No. 202110589512.6, filed on May 28, 2021, the entire contents of which are hereby incorporated by reference.

FIELD OF THE DISCLOSURE

The present disclosure generally relates to the field of display technology and, more particularly, relates to a touch display device, a touch display panel, a touch module and a forming method thereof.

BACKGROUND

With a continuous advancement of science and technology, more and more display devices with a touch function are widely used in people's daily life and work, bringing a great convenience to people's daily life and work, and becoming an indispensable tool for people's work and life today.

A main component of a display device to realize the touch function is a touch module, which includes a plurality of touch electrodes. When a finger touches the touch module, by judging a capacitance change between the touch electrodes or between the touch electrode and the ground, according to the capacitance change, a touch position of the finger is calculated by an integrated circuit (IC).

However, a patterned design of the touch layer results in a slit between adjacent touch electrodes. An optical path difference of a light reflected by the touch electrode and the slit to human eyes is different. Due to a patterned design of the touch electrodes, in a vertical stacking direction of a film, a difference in a structure of the film occurs, which in turn leads to a difference in the reflected light and forms a chromatic aberration. Due to the chromatic aberration between the touch electrode and the slit, a pattern of the touch electrodes is easily perceivable by human eyes and affects a clarity of a display device screen.

BRIEF SUMMARY OF THE DISCLOSURE

One aspect of the present disclosure provides a touch module. The touch module includes a substrate, and a first shadow elimination layer, a touch electrode layer, a second shadow elimination layer, and a bridge layer that are sequentially located on a side of the substrate. The touch electrode layer includes a plurality of first touch electrodes. The bridge layer includes a plurality of bridges, and a bridge of the plurality of bridges connects two adjacent first touch electrodes through a via passing through the second shadow elimination layer.

Another aspect of the present disclosure provides a touch display panel. The touch display panel includes a display module and a touch module. The touch module includes a substrate, and a first shadow elimination layer, a touch electrode layer, a second shadow elimination layer, and a bridge layer that are sequentially located on a side of the substrate. The touch electrode layer includes a plurality of first touch electrodes. The bridge layer includes a plurality of bridges, and a bridge of the plurality of bridges connects two adjacent first touch electrodes through a via passing through the second shadow elimination layer. The touch module is located on a light emitting side of the display module. A refractive index of the touch electrode layer in the touch module is greater than a refractive index of the shadow elimination layer.

Another aspect of the present disclosure provides a touch display device including a touch display panel. The touch module includes a substrate, and a first shadow elimination layer, a touch electrode layer, a second shadow elimination layer, and a bridge layer that are sequentially located on a side of the substrate. The touch electrode layer includes a plurality of first touch electrodes. The bridge layer includes a plurality of bridges, and a bridge of the plurality of bridges connects two adjacent first touch electrodes through a via passing through the second shadow elimination layer. The touch module is located on a light emitting side of the display module. A refractive index of the touch electrode layer in the touch module is greater than a refractive index of the shadow elimination layer.

Another aspect of the present disclosure provides a method of forming a touch module. The method includes: providing a substrate; forming a first shadow elimination layer and a touch electrode layer sequentially on the substrate; etching the touch electrode layer by using a first mask to form a plurality of first touch electrodes; forming a second shadow elimination layer on a side of the touch electrode layer away from the substrate; etching the second shadow elimination layer by using a second mask to form a through hole passing through the second shadow elimination layer; and filling the through hole with a conductive material to form a via, forming a bridge layer on a surface of the second shadow elimination layer, etching the bridge layer by using a third mask to form a plurality of bridges, and a bridge of the plurality of bridges connecting two adjacent first touch electrodes through the via.

BRIEF DESCRIPTION OF THE DRAWINGS

Accompanying drawings in the following description are merely the exemplary embodiments of the present disclosure. For those skilled in the art, without creative efforts, other drawings can be obtained based on the provided drawings and can be encompassed in the present disclosure.

DETAILED DESCRIPTION

The above is a core idea of the present disclosure. To make above objectives, features, and advantages of the present disclosure more obvious and understandable, technical solutions in the embodiments of the present disclosure will be described clearly and completely in conjunction with the accompanying drawings in the embodiments of the present disclosure. Obviously, the described embodiments are only part of the embodiments of the present disclosure, rather than all the embodiments. Based on the embodiments of the present disclosure, all other embodiments obtained by those skilled in the art without creative efforts shall fall within the protection scope of the present disclosure.

Figure 1:
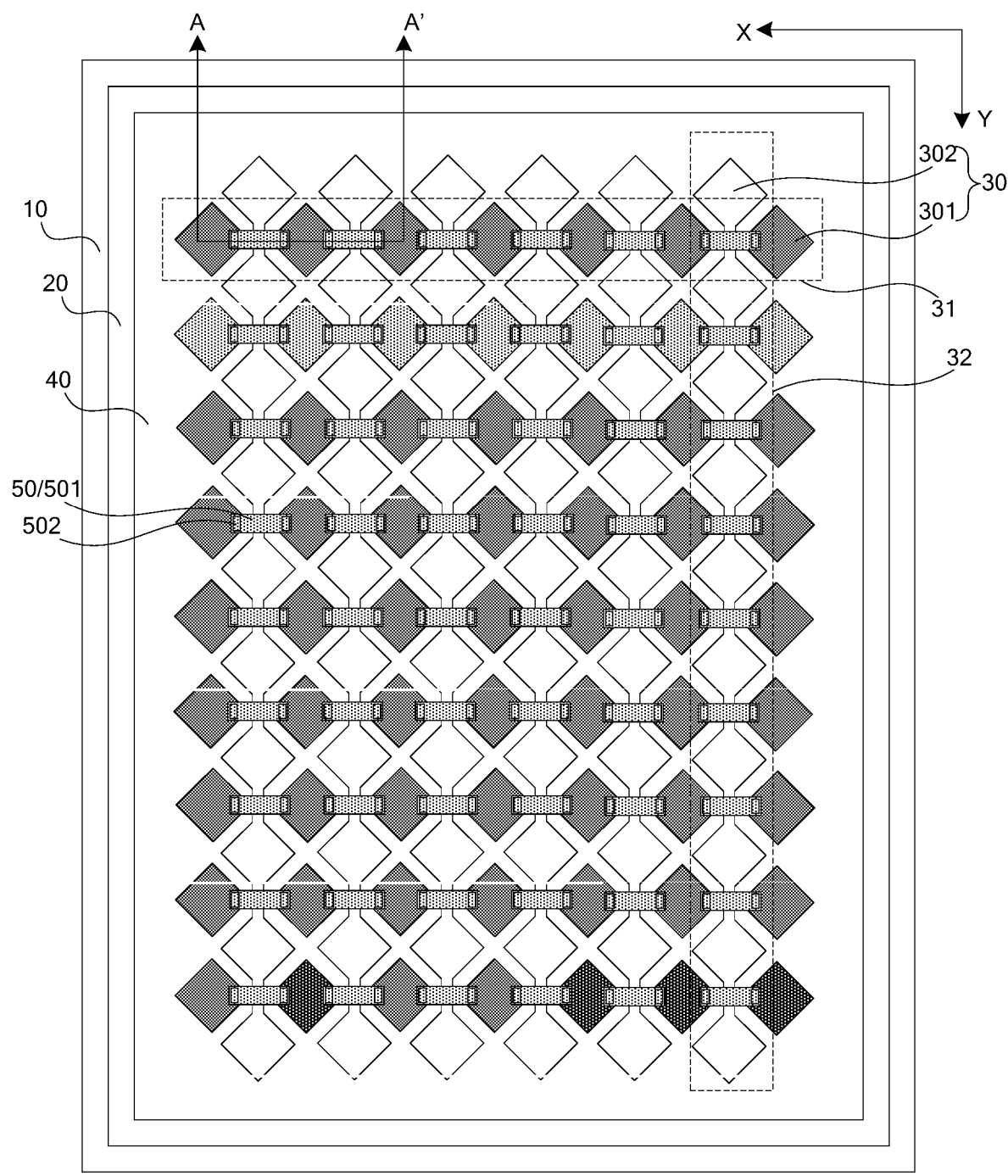
FIG. 1 illustrates a top view of a touch module according to an embodiment of the present disclosure.
Figure 2:
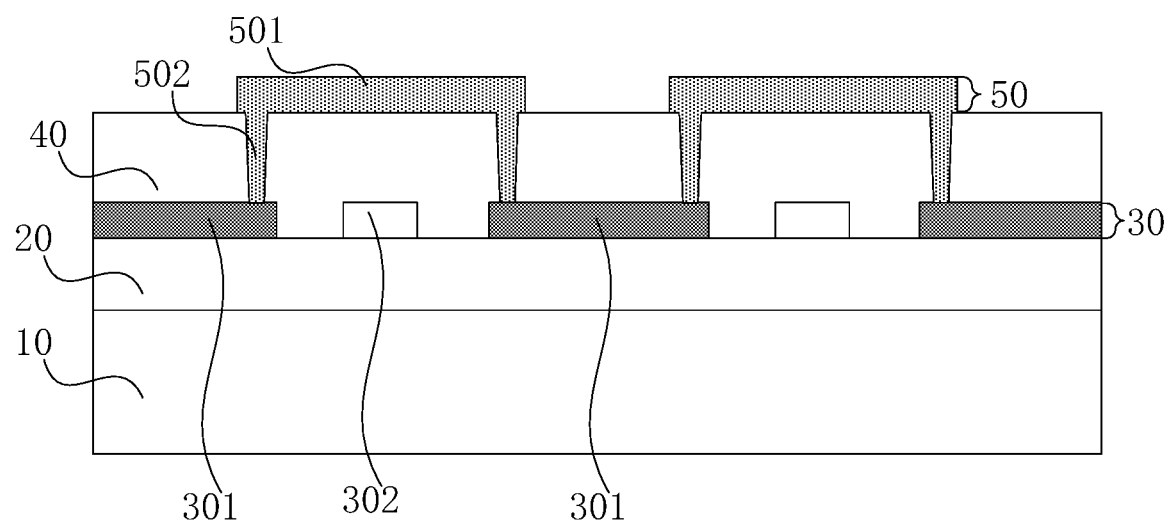
FIG. 2 illustrates a cross-sectional view of the touch module shown in FIG. 1 along a cutting line AA'.

The present disclosure provides a touch module. As shown in FIGS. 1-2, FIG. 1 illustrates a top view of a touch module according to an embodiment of the present disclosure. FIG. 2 illustrates a cross-sectional view of the touch module shown in FIG. 1 along a cutting line AA'. The touch module includes a substrate 10 and a first shadow elimination layer 20, a touch electrode layer 30, a second shadow elimination layer 40, and a bridge layer 50 sequentially located on a side of the substrate. A side of the bridge layer 50 away from the substrate 10 may also have a protective layer or a cover plate, etc.

It should be noted that FIG. 1 is a top view of the touch module. To show the substrate 10, the first shadow elimination layer 20, and the second shadow elimination layer 40 in the top view, boundaries of the above three parts are illustrated in a stepped manner. In actual products, the boundaries of the above three parts can be overlapped.

The electrode layer 30 includes a plurality of first touch electrodes 301. The bridge layer 50 includes a plurality of bridges 501. The bridge 501 connects two adjacent first touch electrodes 301 through a via 502 passing through the second shadow elimination layer 40. The bridge 501 can connect two adjacent first touch electrodes 301 that are originally disconnected in a second direction. It should be noted that a refractive index of the touch electrode layer 30 is greater than a refractive index of the first shadow elimination layer 20 in contact with the touch electrode layer 30. A refractive index of the touch electrode layer 30 is greater than a refractive index of the second shadow elimination layer 40 in contact with the touch electrode layer 30.

The touch electrode layer 30 has the first shadow elimination layer 20 on a side close to the substrate 10. The touch electrode layer 30 has the second shadow elimination layer 40 on a side away from the substrate 10. A refractive index of the touch electrode layer 30 is greater than a refractive index of the first shadow elimination layer 20. A refractive index of the touch electrode layer 30 is greater than a refractive index of the second shadow elimination layer 40. Therefore, reflective interfaces are generated between the first shadow elimination layer 20 and the touch electrode layer 30 with different refractive indexes, and between the touch electrode layer 30 and the second shadow elimination layer 40 with different refractive indexes. An incident light from outside produces a reflected light at each reflective interface. Reflected lights at different interfaces interferes when the reflected lights enter human eyes, so that the reflected lights of different vectors are superimposed and cancelled, optical path differences of the reflected lights between areas where the touch electrodes are located and other areas (such as slits, that is, gaps between two adjacent touch electrodes on a plane where the touch electrode layer 30 is located) tend to be consistent, a chromatic aberration between areas where the touch electrodes are located and the other areas (such as slits) is small, a pattern of the touch electrodes is more difficult to be perceived by human eyes, thereby improving a clarity of a display device screen.

A first shadow elimination layer 20 is provided between the touch electrode layer 30 and the substrate 10. A second shadow elimination layer 40 is provided between the touch electrode layer 30 and the bridge layer 50. That is, upper and lower sides of the touch electrode layer 30 have a shadow elimination layer. Therefore, compared with a solution in which only one side of the touch electrode layer 30 has a shadow elimination layer, in a solution of the present disclosure, a first shadow elimination layer 20 and a second shadow elimination layer 40 are respectively arranged on two layers of the touch electrode layer 30. By providing more reflective interfaces, more reflective lights are generated at interfaces, more coherent cancellation of the reflected lights can be achieved, a chromatic aberration of the reflected lights between the first touch electrodes 301 and the second touch electrodes 302 and other areas (such as slits) other than the touch electrodes can be better reduced, an elimination of patterns of the first touch electrodes 301 and the second touch electrodes 302 can be better realized, that is, a pattern of the touch electrode layer 30 is more difficult to be perceived by human eyes. It should be noted that the chromatic aberration is a dispersion phenomenon caused by optical path differences of different lights. The smaller the optical path differences, the smaller the chromatic aberration.

The touch electrode layer 30 includes a plurality of first touch electrodes 301 and a plurality of second touch electrodes 302. The plurality of first touch electrodes 301 are arranged in an array. The plurality of second touch electrodes 302 are arranged in an array. As shown in FIG. 1, in the array formed by the first touch electrodes 301, a plurality of first touch electrodes 301 in a same row extend in a second direction X. As shown in FIG. 1, a plurality of second touch electrodes 302 in a same column in the array formed by the second touch electrodes 302 extend in a first direction Y. A plurality of second touch electrodes 302 in a same column are integrated and connected in a same layer. The second touch electrodes 302 in different columns are isolated and insulated. The first touch electrodes 301 in a same row are separated by the second touch electrodes 302, and the first touch electrodes 301 in a same row are connected by the bridge 501. The first touch electrodes 301 in different rows are isolated and insulated.

In addition, a second shadow elimination layer 40 is provided between the bridge layer 50 and the touch electrode layer 30, or the second shadow elimination layer 40 is located between the bridge layer 50 and the touch electrode layer 30. Therefore, the second shadow elimination layer 40 can be used to insulate the bridge 501 and the second touch electrodes 302 to prevent the first touch electrodes 301 and the second touch electrodes 302 from being short-circuited and affecting the touch function. That is, in the present disclosure, the second shadow elimination layer 40 is used to replace an insulating layer to perform an insulating function, thereby simplifying a process flow and saving a cost. In addition, according to a capacitance formula $$C = \frac{\varepsilon S}{4\pi Kd},$$

the greater a thickness d of a dielectric layer, the smaller a capacitance C. Here ε represents an dielectric, constant of the second elimination layer 40, S represents an overlapping area between the touch electrode layer 30 and the bridge layer 50, and K represents a constant. A thickness of a dielectric layer between the bridge layer 50 and the touch electrode layer 30, that is, a thickness of the second shadow elimination layer 40, can be increased to make a capacitance between the touch electrode layer 30 and the bridge layer 50 smaller, that is, make a capacitance of the touch module itself smaller, and further make a touch sensitivity of the touch module higher.

In some embodiments, as shown in FIG. 1, The touch electrode layer 30 further includes a plurality of second touch electrode strips 32. The second touch electrode strip 32 includes a plurality of second touch electrodes 302 integrally connected in the first direction Y. The second touch electrode strips 32 extend along the first direction Y. A plurality of second touch electrode strips 32 are sequentially arranged along the second direction X.

A plurality of first touch electrodes 301 are arranged in an array. Adjacent first touch electrodes 301 in the second direction X are sequentially connected by bridges 501 and a via 502. A plurality of first touch electrodes 301 sequentially connected in the second direction X constitutes a first touch electrode strip 31. A plurality of the first touch electrode strips 31 are sequentially arranged in the first direction Y. The first touch electrode strip 31 and the second touch electrode strip 32 intersect with each other in an insulated manner. The first touch electrode 301 and the second touch electrode 302 form a mutual capacitance, so that a touch position can be determined according to a change of the capacitance value of the mutual capacitance.

Figure 3:
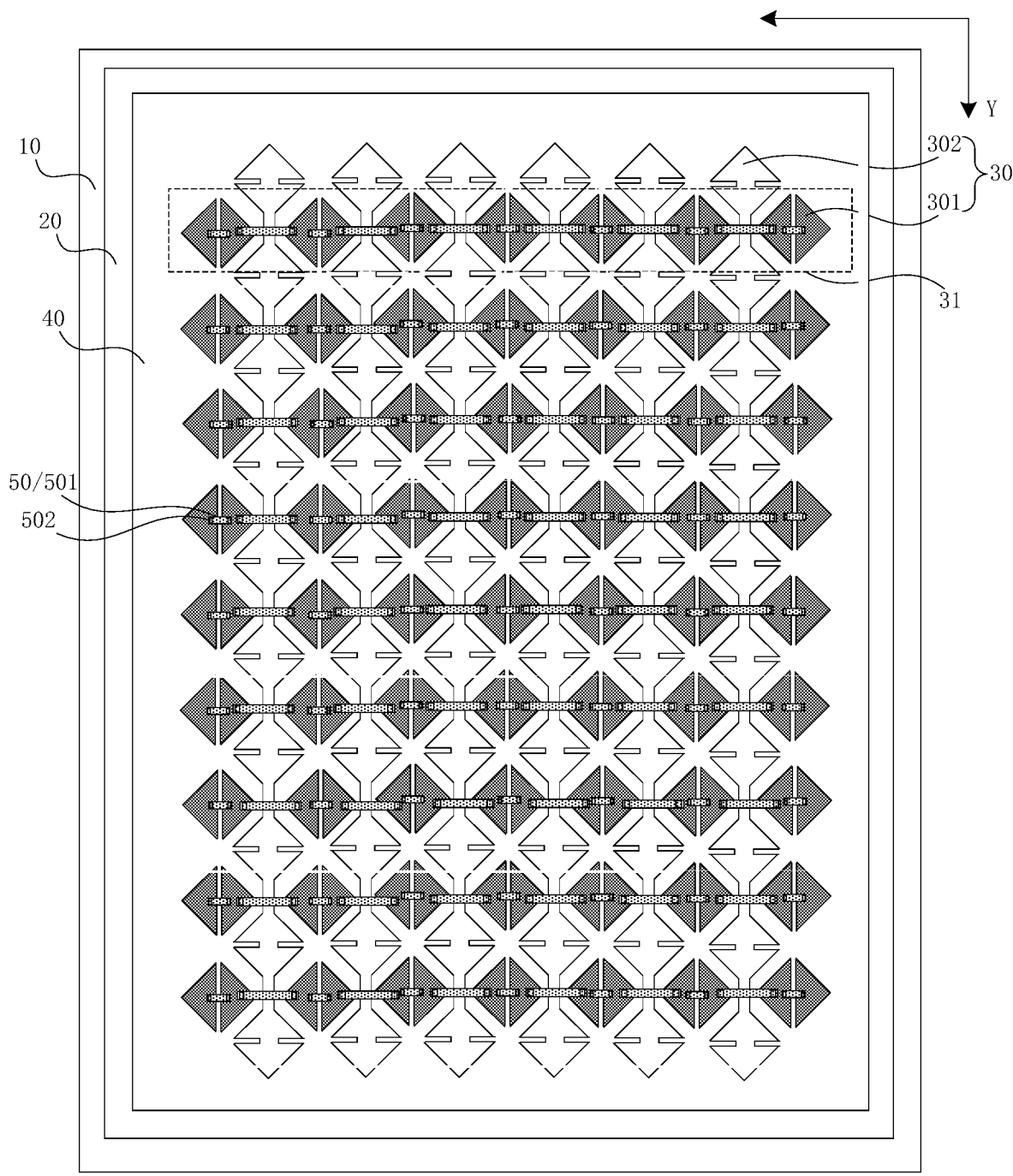
FIG. 3 illustrates a top view of a touch module according to another embodiment of the present disclosure.

It should be noted that, in some embodiments, only the first touch electrode strip 31 and the second touch electrode 302 of the shape shown in FIG. 1 are taken as an example for description, which is not limited herein. In other embodiments, as shown in FIG. 3, FIG. 3 illustrates a top view of a touch module according to another embodiment of the present disclosure. The first touch electrode 301 and the second touch electrode 302 can also be triangular electrodes, etc.

Figure 4:
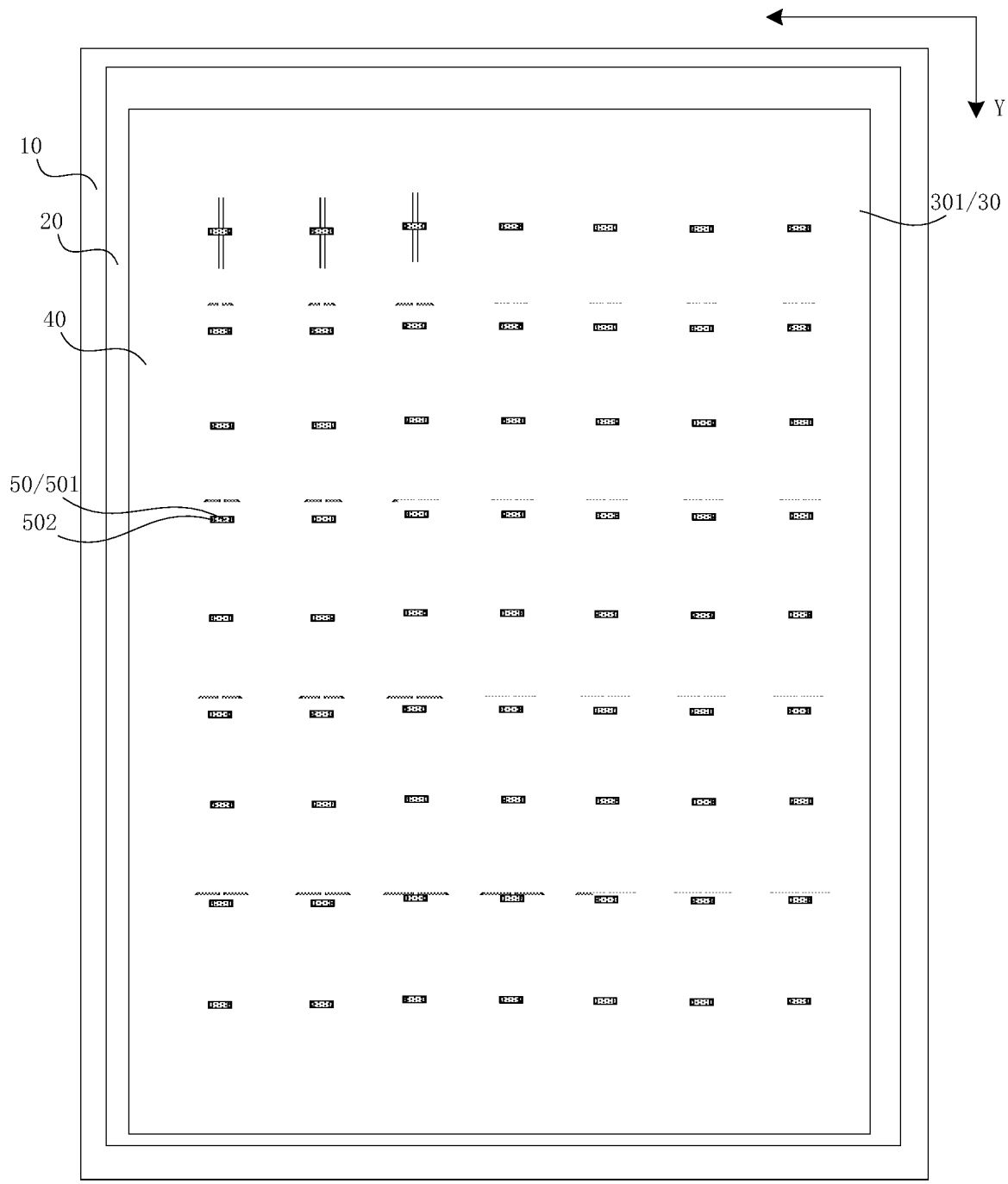
FIG. 4 illustrates a top view of a touch module according to another embodiment of the present disclosure.

In other embodiments, as shown in FIG. 4, FIG. 4 illustrates a top view of a touch module according to another embodiment of the present disclosure. The first touch electrode 301 may also be a self-capacitive touch electrode. For example, the first touch electrode 301 is a triangular electrode. Two adjacent first touch electrodes 301 are connected by the bridge 501 and the via 502 to form a block electrode, A plurality of block electrodes are arranged in an array to form a self-capacitive touch electrode.

Figure 5:
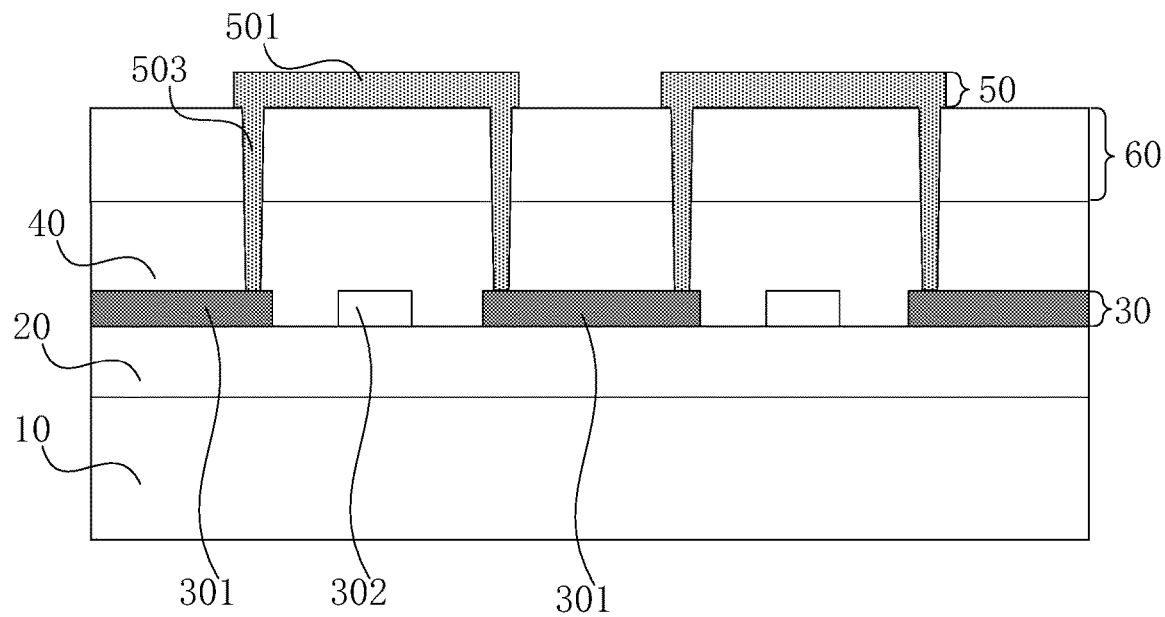
FIG. 5 illustrates a cross-sectional view of a touch module according to another embodiment of the present disclosure.

In other embodiments, as shown in FIG. 5, FIG. 5 illustrates a cross-sectional view of a touch module according to another embodiment of the present disclosure. The touch module also includes an insulating layer 60.

The insulating layer 60 is located between the second shadow elimination layer 40 and the bridge layer 50. The bridge 501 connects two adjacent first touch electrodes 301 through a via 503 passing through the second shadow elimination layer 40 and the insulating layer 60. In other embodiments, the insulating layer 60 may also be located between the second shadow elimination layer 40 and the touch electrode layer 30.

Since the second shadow elimination layer 40 and the insulating layer 60 are provided between the touch electrode layer 30 and the bridge layer 50, a thickness of the second shadow elimination layer 40 and/or a thickness of the insulating layer 60 can be adjusted to make a capacitance between the touch electrode layer 30 and the bridge layer 50 smaller, that is, make a capacitance of the touch module itself smaller.

When a film thickness exceeds a certain limit, e.g., a thickness of silicon nitride exceeds 6000 angstroms, or a thickness of silicon oxide exceeds 5000 angstroms, only a low-temperature process can be used to form the film. Therefore, when a thickness of the insulating layer 60 exceeds the limit and a thickness of the shadow elimination layer does not exceed the limit, since the bridge layer 50 is located on a side of the second shadow elimination layer 40 away from the substrate 10, that is, the bridge layer 50 is formed after the first shadow elimination layer 20 and the second shadow elimination layer 40 are formed, a high-temperature process of forming a shadow elimination layer does not affect the insulating layer 60 and other structures that require low-temperature film formation, thereby ensuring a stability of a film structure of the touch module.

To obtain a better touch performance, in some embodiments, a thickness of the touch electrode layer 30, a thickness of the insulating layer 60, and/or a thickness of the second shadow elimination layer 40 may be increased.

However, an increase in the thickness of the touch electrode layer 30 can affect optical path differences between areas where the touch electrodes (the first touch electrodes 301 and the second touch electrodes 302) are located and other areas (such as slits) outside the touch electrodes, and can further affect a shadow elimination effect, resulting in a poor shadow elimination effect. That is, chromatic aberration between the first touch electrodes 301 and the second touch electrodes 302 and other areas (such as slits) is large. To obtain a better touch performance while ensuring that the shadow elimination effect is not affected, in some embodiments, a material of the insulating layer 60 is silicon oxide or an OC (Over Coating, a transparent resin material) material with a better insulating performance. Other materials with better insulating properties can also be applied to the insulating layer 60.

Based on the above description, to better ensure a shadow elimination effect, in some embodiments, a material of the insulating layer 60 is silicon oxide. A thickness of the silicon oxide ranges from 3000 angstroms to 4000 angstroms. In other embodiments, a material of the insulating layer 60 may also be an overcoat material, and a thickness of the overcoat material ranges from 12,500 angstroms to 20,000 angstroms. In one embodiment, a process of forming silicon oxide may be a CVD (i.e., Chemical Vapor Deposition) process. A process of forming the overcoat material may be a coating process. A difference in a thickness range of silicon oxide and the overcoat material is determined by a forming process thereof.

Based on the above description, to obtain a better touch performance, in some embodiments, a material of the touch electrode layer 30 is generally ITO (Indium Tin Oxide). Based on a production process condition, a thickness of the ITO is set to range from 500 angstroms to 1350 angstroms. Optionally, a thickness of the touch electrode layer 30 can be set to be 500 angstroms to 1250 angstroms. That is, when a thickness of the touch electrode layer 30 is in a range of 500 angstroms to 1350 angstroms, not only a shadow elimination effect can be ensured, but also a better touch performance can be obtained.

In other embodiments, a material of the touch electrode layer 30 is ITO. A thickness of the touch electrode layer 30 ranges from 900 angstroms to 1200 angstroms. A material of the bridge layer 50 is also ITO. A thickness range of the bridge layer 50 is 1100 angstroms to 1350 angstroms. Based on the above setting, not only a better touch performance can be obtained, but also a chromatic aberration between areas where touch electrodes are located and an area where a bridge is located, and a chromatic aberration between areas where touch electrodes are located and areas where slits between two adjacent touch electrodes are located can be further reduced. A shadow elimination effect can be further optimized.

In a specific embodiment, the chromatic aberration between the areas where the touch electrodes are located and the area where the bridge is located can be reduced to 0.38. The chromatic aberration between the areas where the touch electrodes are located and the area where the slits between the touch electrodes are located can be reduced to 0.143. It should be noted that if a chromatic aberration is less than 0.5, human eyes are difficult to distinguish a chromatic aberration requirement under a normal use distance and lighting conditions. That is, a shadow elimination requirement is met.

Optionally, in some embodiments, a material of the insulating layer 60 is silicon oxide with a thickness of 3500 angstroms. A material of the touch electrode layer 30 is ITO with a thickness of 1250 angstroms. In other embodiments, the material of the insulating layer 60 is an overcoat material with a thickness of 15000 angstroms. A material of the touch electrode layer 30 is ITO with a thickness of 750 angstroms. In other embodiments, the material of the insulating layer 60 is an overcoat material with a thickness of 19500 angstroms. A material of the touch electrode layer 30 is ITO with a thickness of 1250 angstroms.

Figure 6:
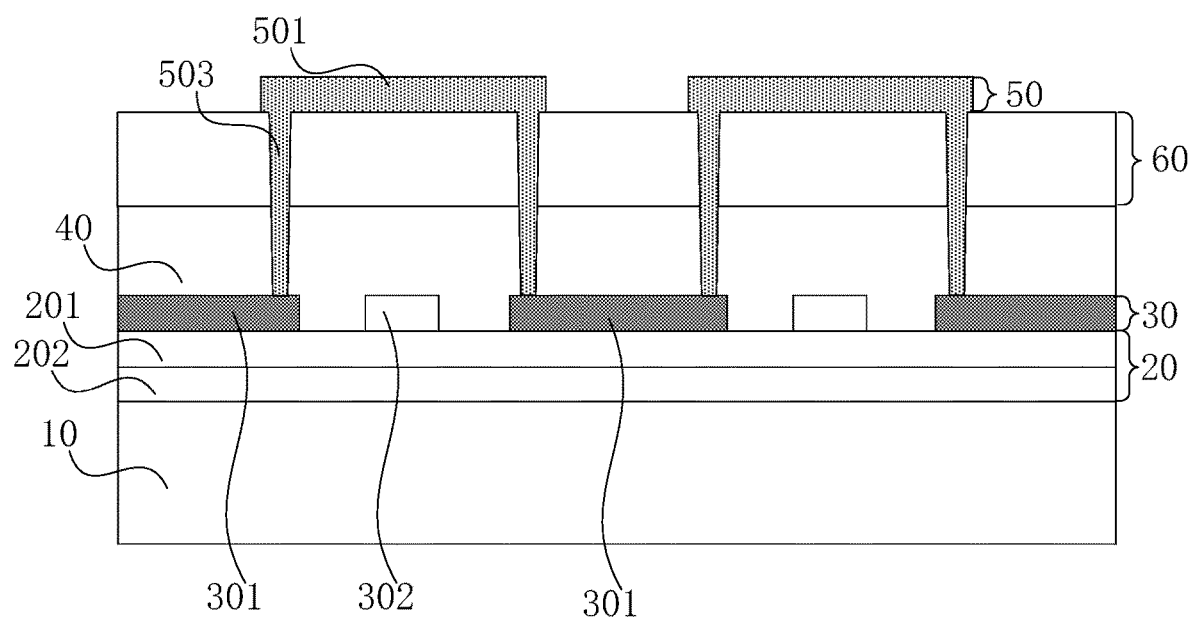
FIG. 6 illustrates a cross-sectional view of a touch module according to another embodiment of the present disclosure.

Based unless any of the above embodiments, in some embodiments, as shown in FIG. 6, FIG. 6 illustrates a cross-sectional view of a touch module according to another embodiment of the present disclosure. The first shadow elimination layer 20 includes at least one first sub-shadow-elimination-layer 201 and at least one second sub-shadow-elimination-layer 202. For example, the first shadow elimination layer 20 may include a first sub-shadow-elimination-layer 201 and a second sub-shadow-elimination-layer 202. Or the first shadow elimination layer 20 may include a first sub-shadow-elimination-layer 201 and two second sub-shadow-elimination-layers 202. Or the first shadow elimination layer 20 may include two layers of first sub-shadow-elimination-layer 201 and two layers of second sub-shadow-elimination-layer 202.

A refractive index of the first sub-shadow-elimination-layer 201 is smaller than a refractive index of the second sub-shadow-elimination-layer 202. The first sub-shadow-elimination-layer 201 and the second sub-shadow-elimination-layer 202 are alternately arranged in a direction perpendicular to the substrate 10. The touch electrode layer 30 is arranged adjacent to the first sub-shadow-elimination-layer 201. Among the first sub-shadow-elimination-layer 201 and the second sub-shadow-elimination-layer 202 that are closest to the touch electrode layer 30, the first sub-shadow-elimination-layer 201 is located between the touch electrode layer 30 and the second sub-shadow-elimination-layer 202.

It should be noted that the refractive index of the touch electrode layer 30 is greater than the refractive index of the first sub-shadow-elimination-layer 201.

Since the refractive index of the touch electrode layer 30 is greater than the refractive index of the first sub-shadow-elimination-layer 201, and the refractive index of the first sub-shadow-elimination-layer 201 is smaller than the refractive index of the second sub-shadow-elimination-layer 202, a reflective interface is generated between the touch electrode layer 30 and the first sub-shadow-elimination-layer 201, and a reflective interface is generated between the first sub-shadow-elimination-layer 201 and the second sub-shadow-elimination-layer 202. Reflected lights at different interfaces interfere when incident to human eyes, so that the reflected lights of different vectors are superimposed and canceled, and can further make a chromatic aberration between areas where the touch electrodes are located and other areas (such as slits) smaller.

It should also be noted that the greater a refractive index difference between the touch electrode layer 30 and the first sub-shadow-elimination-layer 201, the greater a refractive index difference between the first sub-shadow-elimination-layer 201 and the second sub-shadow-elimination-layer 202, the greater a light quantity of the reflected light at an interface, the better a coherent cancellation effect of the reflected light from each interface, and the better a shadow elimination effect.

To ensure a shadow elimination effect of the shadow elimination layer, in some embodiments, a material of the first sub-shadow-elimination-layer 201 is silicon oxide, and a material of the second sub-shadow-elimination-layer 202 is silicon nitride. In other embodiments, the first sub-shadow-elimination-layer 201 and the second sub-shadow-elimination-layer 202 can also be made of other materials, such as silicon oxynitride, etc.

To ensure a shadow elimination effect of the shadow elimination layer, in some embodiments, a thickness of the first sub-shadow-elimination-layer 201 ranges from 250 angstroms to 300 angstroms. A thickness of the second sub-shadow-elimination-layer 202 ranges from 250 angstroms to 300 angstroms.

For example, in some embodiments, a material of the insulating layer 60 is silicon oxide with a thickness of 3500 angstroms. A material of the touch electrode layer 30 is ITO with a thickness of 1250 angstroms. A material of the first sub-shadow-elimination-layer 201 is silicon oxide with a thickness is 250 angstroms. A material of the second sub-shadow-elimination-layer 202 is silicon nitride with a thickness of 250 angstroms.

In other embodiments, a material of the insulating layer 60 is an overcoat material with a thickness of 15000 angstroms. A material of the touch electrode layer 30 is ITO with a thickness of 750 angstroms. A material of the first sub-shadow-elimination-layer 201 is silicon oxide with a thickness of 257 angstroms. A material of the second sub-shadow-elimination-layer 202 is silicon nitride with a thickness of 272 angstroms.

In other embodiments, a material of the insulating layer 60 is an overcoat material with a thickness of 19,950 angstroms. A material of the touch electrode layer 30 is ITO with a thickness of 1250 angstroms. A material of the first sub-shadow-elimination-layer 201 is silicon oxide with a thickness of 276 angstroms. A material of the shadow elimination layer 202 is silicon nitride with a thickness of 250 angstroms.

Figure 7:
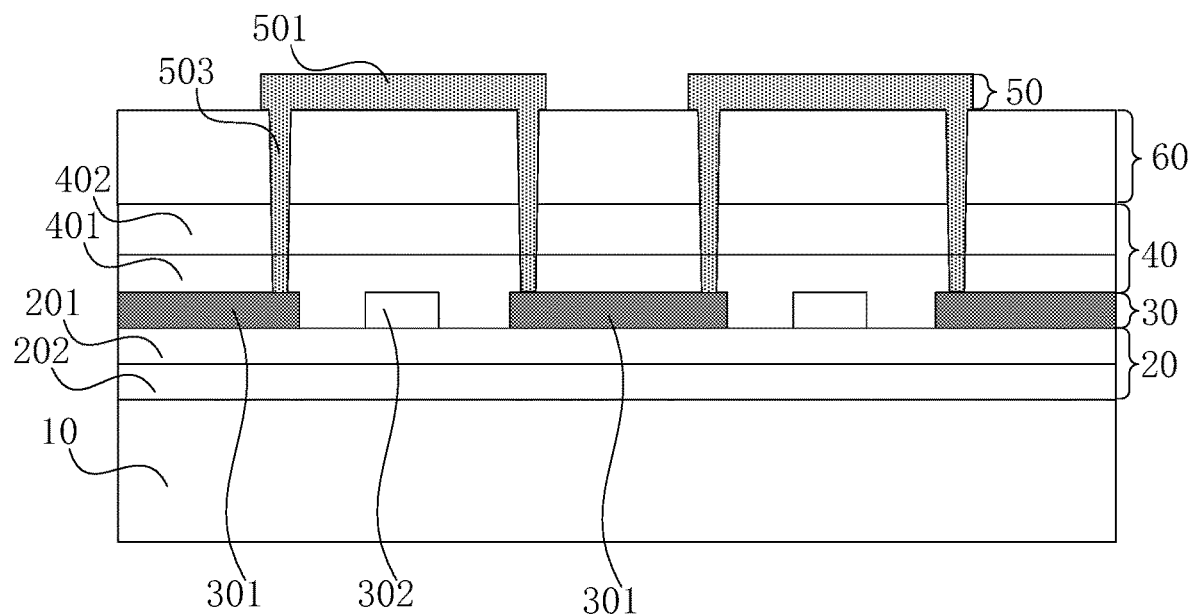
FIG. 7 illustrates a cross-sectional view of a touch module according to another embodiment of the present disclosure.

Based on any of the above embodiments, in some embodiments, as shown in FIG. 7, FIG. 7 illustrates a cross-sectional view of a touch module according to another embodiment of the present disclosure. The second shadow elimination layer 40 includes at least one third sub-shadow-elimination-layer 401 and at least one fourth sub-shadow-elimination-layer 402.

A refractive index of the third sub-shadow-elimination-layer 401 is smaller than a refractive index of the fourth sub-shadow-elimination-layer 402. Similarly, a refractive index of the touch electrode layer 30 is greater than a refractive index of the third sub-shadow-elimination-layer 401. The third sub-shadow-elimination-layer 401 and the fourth sub-shadow-elimination-layer 402 are alternately arranged in the direction perpendicular to the substrate 10. The touch electrode layer 30 is arranged adjacent to the third sub-shadow-elimination-layer 401. In other words, among the third sub-shadow-elimination-layer 401 and the fourth sub-shadow-elimination-layer 402 that are closest to the touch electrode layer 30, the third sub-shadow-elimination-layer 401 is located between the touch electrode layer 30 and the fourth sub-shadow-elimination-layer 402.

It should be noted that a refractive index of the touch electrode layer 30 is greater than a refractive index of the third sub-shadow-elimination-layer 401. The refractive index of the touch electrode layer 30 is greater than, less than or equal to the refractive index of the fourth sub-shadow-elimination-layer 402.

Since the refractive index of the touch electrode layer 30 is greater than the refractive index of the third sub-shadow-elimination-layer 401, and the refractive index of the third sub-shadow-elimination-layer 401 is smaller than the refractive index of the fourth sub-shadow-elimination-layer 402, a reflective interface is generated between the touch electrode layer 30 and the third sub-shadow-elimination-layer 401, and a reflective interface is generated between the third sub-shadow-elimination-layer 401 and the fourth sub-shadow-elimination-layer 402. Reflected lights at different interfaces interferes when incident to human eyes, so that the reflected lights of different vectors are superimposed and canceled, and can further make a chromatic aberration between areas where the touch electrodes are located and other areas (such as slits) smaller.

It should also be noted that the greater the refractive index difference between the touch electrode layer 30 and the third sub-shadow-elimination-layer 401, the greater the refractive index difference between the third sub-shadow-elimination-layer 401 and the fourth sub-shadow-elimination-layer 402, the greater a light quantity of the reflected light at an interface, the better a coherent cancellation effect of the reflected light at each interface, and the better a shadow elimination effect.

To ensure a shadow elimination effect of the shadow elimination layer, in some embodiments, a material of the third sub-shadow-elimination-layer 401 is silicon oxide, and a material of the fourth sub-shadow-elimination-layer 402 is silicon nitride. In other embodiments, the third sub-shadow-elimination-layer 401 and the fourth sub-shadow-elimination-layer 402 can also be made of other materials, such as silicon oxynitride, etc.

To ensure the shadow elimination effect of the shadow elimination layer, in some embodiments, a thickness of the third sub-shadow-elimination-layer 401 ranges from 250 angstroms to 300 angstroms. A thickness of the fourth sub-shadow-elimination-layer 402 ranges from 250 angstroms to 430 angstroms.

For example, in some embodiments, a material of the insulating layer 60 is silicon oxide with a thickness of 3500 angstroms. A material of the touch electrode layer 30 is ITO with a thickness of 1250 angstroms. A material of the first sub-shadow-elimination-layer 201 is silicon oxide with a thickness of 250 angstroms. A material of the second sub-shadow-elimination-layer 202 is silicon nitride with a thickness of 250 angstroms. A material of the third sub-shadow-elimination-layer 401 is silicon oxide with a thickness of 250 angstroms. A material of the fourth sub-shadow-elimination-layer 402 is silicon nitride with a thickness of 250 angstroms.

In other embodiments, a material of the insulating layer 60 is an overcoat material with a thickness of 15000 angstroms. A material of the touch electrode layer 30 is ITO with a thickness of 750 angstroms. A material of the first sub-shadow-elimination-layer 201 is silicon oxide with a thickness of 257 angstroms. A material of the second sub-shadow-elimination-layer 202 is silicon nitride with a thickness of 272 angstroms. A material of the third sub-shadow-elimination-layer 401 is silicon oxide with a thickness of 250 angstroms. A material of the fourth sub-shadow-elimination-layer 402 is silicon nitride with a thickness of 405 angstroms.

In other embodiments, a material of the insulating layer 60 is an overcoat material with a thickness of 19500 angstroms. A material of the touch electrode layer 30 is ITO with a thickness of 1250 angstroms. A material of the first sub-shadow-elimination-layer 201 is silicon oxide with a thickness of 276 angstroms. A material of the second sub-shadow-elimination-layer 202 is silicon nitride with a thickness of 250 angstroms. A material of the third sub-shadow-elimination-layer 401 is silicon oxide with a thickness of 260 angstroms. A material of the fourth sub-shadow-elimination-layer 402 is silicon nitride with a thickness of 397 angstroms.

Figure 8:
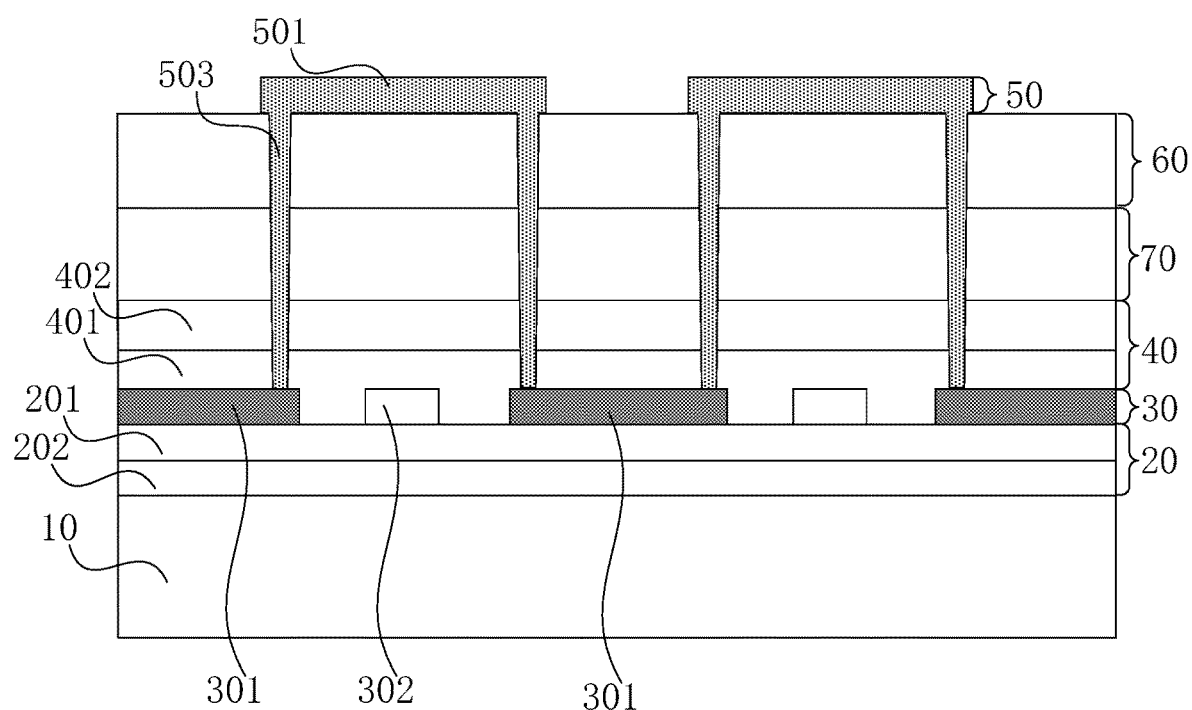
FIG. 8 illustrates a cross-sectional view of a touch module according to another embodiment of the present disclosure.

Based on any of the above embodiments, in some embodiments, as shown in FIG. 8, FIG. 8 illustrates a cross-sectional view of a touch module according to another embodiment of the present disclosure. The touch module also includes at least one third layer 70 of shadow elimination. At least one third shadow elimination layer 70 is located between the second shadow elimination layer 40 and the bridge layer 50. A thickness of the third shadow elimination layer 70 is greater than a thickness of the second shadow elimination layer 40, so that the thicker third shadow elimination layer 70 can further ensure a shadow elimination effect.

Figure 9:
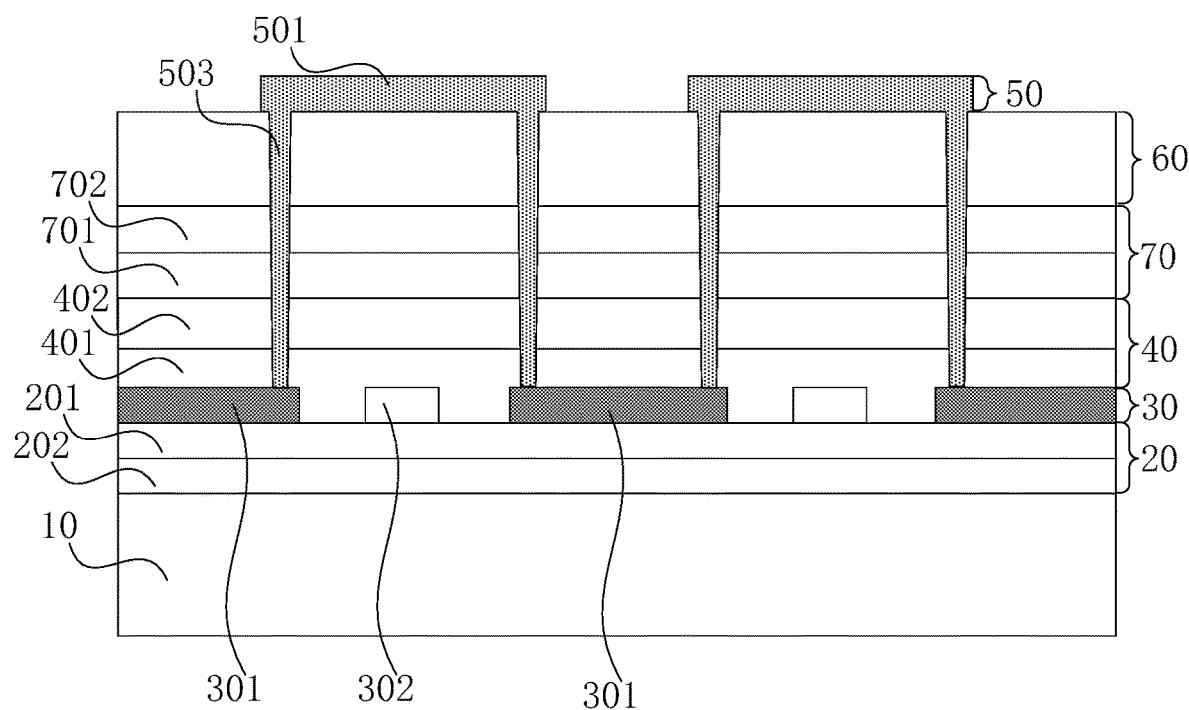
FIG. 9 illustrates a cross-sectional view of a touch module according to another embodiment of the present disclosure.

In some embodiments, as shown in FIG. 9, FIG. 9 illustrates a cross-sectional view of a touch module according to another embodiment of the present disclosure. The third shadow elimination layer 70 includes at least one fifth sub-shadow-elimination-layer 701 and at least one sixth sub-shadow-elimination-layer 702.

A refractive index of the fifth sub-shadow-elimination-layer 701 is smaller than a refractive index of the sixth sub-shadow-elimination-layer 702. Similarly, a refractive index of the touch electrode layer 30 is greater than a refractive index of the fifth sub-shadow-elimination-layer 701. The fifth sub-shadow-elimination-layer 701 and the sixth sub-shadow-elimination-layer 702 are alternately arranged in the direction perpendicular to the substrate 10. The touch electrode layer 30 is arranged adjacent to the fifth sub-shadow-elimination-layer 701. In other words, among the fifth sub-shadow-elimination-layer 701 and the sixth sub-shadow-elimination-layer 702 that are closest to the touch electrode layer 30, the fifth sub-shadow-elimination-layer 701 is located between the touch electrode layer 30 and the sixth sub-shadow-elimination-layer 702. Or the sixth sub-shadow-elimination-layer 702 is located between the fifth sub-shadow-elimination-layer 701 and the bridge layer 50.

It should be noted that a refractive index of the fourth sub-shadow-elimination-layer 401 is greater than a refractive index of the fifth sub-shadow-elimination-layer 701. A refractive index of the fourth sub-shadow-elimination-layer 401 is greater than, less than or equal to a refractive index of the sixth sub-shadow-elimination-layer 702.

Since the refractive index of the fourth sub-shadow-elimination-layer 401 is greater than the refractive index of the fifth sub-shadow-elimination-layer 701, and the refractive index of the fifth sub-shadow-elimination-layer 701 is smaller than the refractive index of the sixth sub-shadow-elimination-layer 702, a reflective interface is generated between the fourth sub-shadow-elimination-layer 401 and the fifth sub-shadow-elimination-layer 701, and a reflective interface is generated between the fifth sub-shadow-elimination-layer 701 and the sixth sub-shadow-elimination-layer 702. Reflected lights at different interfaces interfere when incident to human eyes, so that the reflected lights of different vectors are superimposed and canceled, and can further make a chromatic aberration between the areas where the touch electrodes are located and other areas (such as slits) smaller.

It should also be noted that the greater a refractive index difference between the fourth sub-shadow-elimination-layer 401 and the fifth sub-shadow-elimination-layer 701, the greater a refractive index difference between the fifth sub-shadow-elimination-layer 701 and the sixth sub-shadow-elimination-layer 702, the greater a light quantity of the reflected light at an interface, the better a coherent cancellation effect of the reflected light at each interface, and the better a shadow elimination effect.

To ensure a shadow elimination effect of the shadow elimination layer, in some embodiments, a material of the fifth sub-shadow-elimination-layer 701 is silicon oxide, and a material of the sixth sub-shadow-elimination-layer 702 is silicon nitride. In other embodiments, the fifth sub-shadow-elimination-layer 701 and the sixth sub-shadow-elimination-layer 702 can also be made of other materials, such as silicon oxynitride, etc.

To ensure the shadow elimination effect of the shadow elimination layer, in some embodiments, a thickness of the fifth sub-shadow-elimination-layer 701 ranges from 450 angstroms to 550 angstroms. A thickness of the sixth sub-shadow-elimination-layer 702 ranges from 250 angstroms to 270 angstroms.

For example, in some embodiments, a material of the insulating layer 60 is an overcoat material with a thickness of 15000 angstroms. A material of the touch electrode layer 30 is ITO with a thickness of 750 angstroms. A material of the first sub-shadow-elimination-layer 201 is silicon oxide with a thickness of 257 angstroms. A material of the second sub-shadow-elimination-layer 202 is silicon nitride with a thickness of 272 angstroms. A material of the third sub-shadow-elimination-layer 401 is silicon oxide with a thickness of 250 angstroms. A material of the fourth sub-shadow-elimination-layer 402 is silicon nitride with a thickness of 405 angstroms. A material of the fifth sub-shadow-elimination-layer 701 is silicon nitride with a thickness of 520 angstroms. A material of the sixth sub-shadow-elimination-layer 702 is silicon nitride with a thickness of 250 angstroms. A reflectivity of the touch module is about 0.188%, and a chromatic aberration is about 0.39, which satisfies an optical requirement, that is, the shadow elimination requirement. The optical requirement means that a reflectivity is less than 0.4% and a chromatic aberration is less than 2.

In other embodiments, a material of the insulating layer 60 is an overcoat material with a thickness of 19500 angstroms. A material of the touch electrode layer 30 is ITO with a thickness of 1250 angstroms. A material of the first sub-shadow-elimination-layer 201 is silicon oxide with a thickness of 276 angstroms. A material of the second sub-shadow-elimination-layer 202 is silicon nitride with a thickness of 250 angstroms. A material of the third sub-shadow-elimination-layer 401 is silicon oxide with a thickness of 260 angstroms. A material of the fourth sub-shadow-elimination-layer 402 is silicon nitride with a thickness of 397 angstroms. A material of the fifth sub-shadow-elimination-layer 701 is silicon nitride with a thickness of 477 angstroms. A material of the sixth sub-shadow-elimination-layer 702 is silicon nitride with a thickness of 250 angstroms. A reflectivity of the touch module is about 0.171%, and a chromatic aberration is about 0.261, which satisfies the optical requirement.

Figure 10:
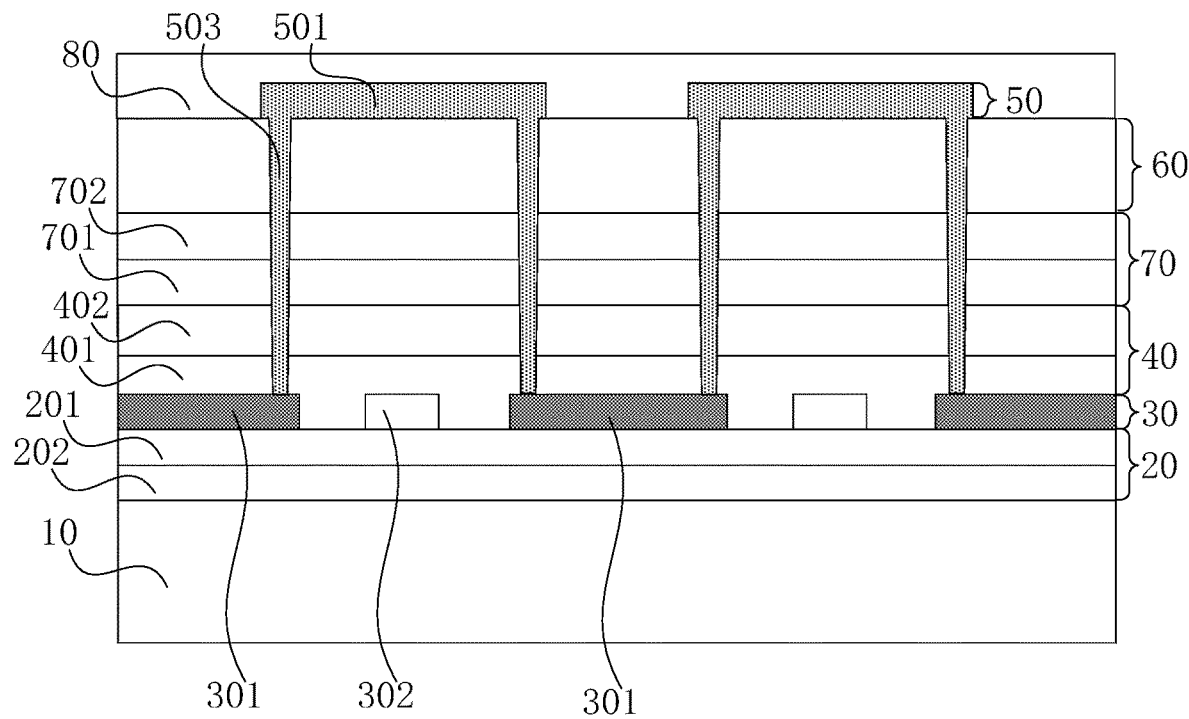
FIG. 10 illustrates a cross-sectional view of a touch module according to another embodiment of the present disclosure.

Based on any of the above embodiments, in some embodiments, as shown in FIG. 10, FIG. 10 illustrates a cross-sectional view of a touch module according to another embodiment of the present disclosure. The touch module also includes a fourth shadow elimination layer 80 on a side of the bridge layer 50 away from the substrate 10, to further eliminate a chromatic aberration between the bridge 501 and other area in a direction parallel to the substrate 10 through the fourth shadow elimination layer 80, so that a shadow of the bridge 501 is optically eliminated and a pattern of the bridge 501 is not easy to be perceived by human eyes.

In some embodiments, the fourth shadow elimination layer 80 may only include at least one layer of silicon oxide, or may only include at least one layer of silicon nitride, or may include at least one layer of silicon oxide and at least one layer of silicon nitride, etc.

Figure 11:
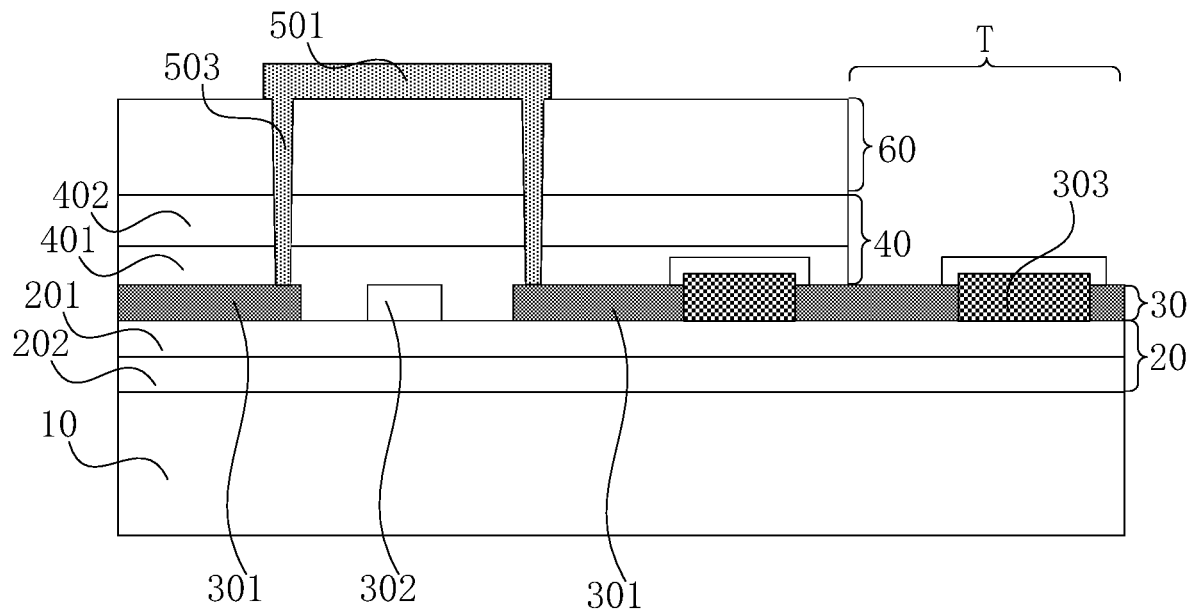
FIG. 11 illustrates a cross-sectional view of a touch module according to another embodiment of the present disclosure.

In some embodiments, as shown in FIG. 11, FIG. 11 illustrates a cross-sectional view of a touch module according to another embodiment of the present disclosure. Both the second shadow elimination layer 40 and the insulating layer 60 include a step area T. The step area T exposes a connection terminal 303 in the touch electrode layer 30 so that the connection terminal 303 is connected to an external circuit.

It should be noted that the external circuit may be a driver chip or the like. Since pins of the driving chip need to be connected to the connection terminals 303 through a bonding process, the step area T needs to be formed to expose the connection terminals 303 in the touch electrode layer 30.

The second shadow elimination layer 40 and the insulating layer 60 both need to be etched to form the via 503, and both need to be etched to form the step area T. Therefore, in some embodiments, the second shadow elimination layer 40 and the insulating layer 60 share a same mask, which not only simplifies a process flow and shortens a process time, but also reduces one mask, thereby reducing a forming cost.

Figure 12:
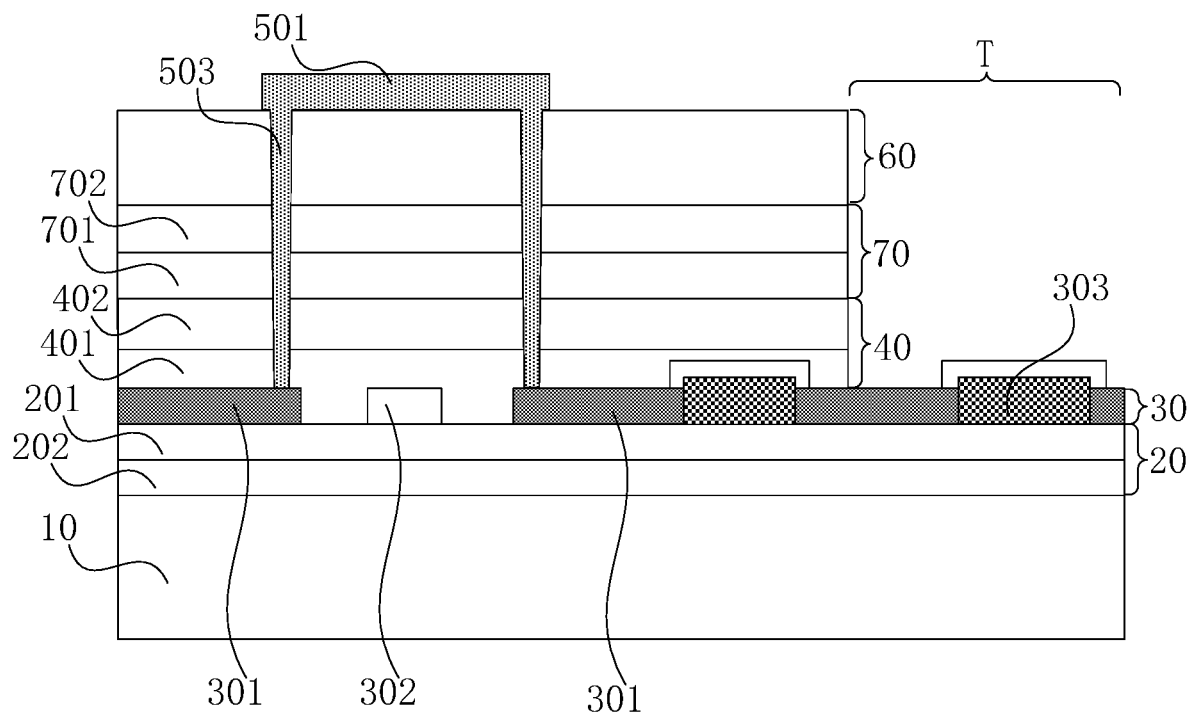
FIG. 12 illustrates a cross-sectional view of a touch module according to another embodiment of the present disclosure.

In some other embodiments, the touch module includes a third shadow elimination layer 70. As shown in FIG. 12, FIG. 12 illustrates a cross-sectional view of a touch module according to another embodiment of the present disclosure. The second shadow elimination layer 40, the third shadow elimination layer 70, and the insulating layer 60 all include a step area T. The step area T exposes the connection terminal 303 in the touch electrode layer 30 so that the connection terminal 303 is connected to an external circuit. The second shadow elimination layer 40, the third shadow elimination layer 70 and the insulating layer 60 share a same mask.

Figure 13:
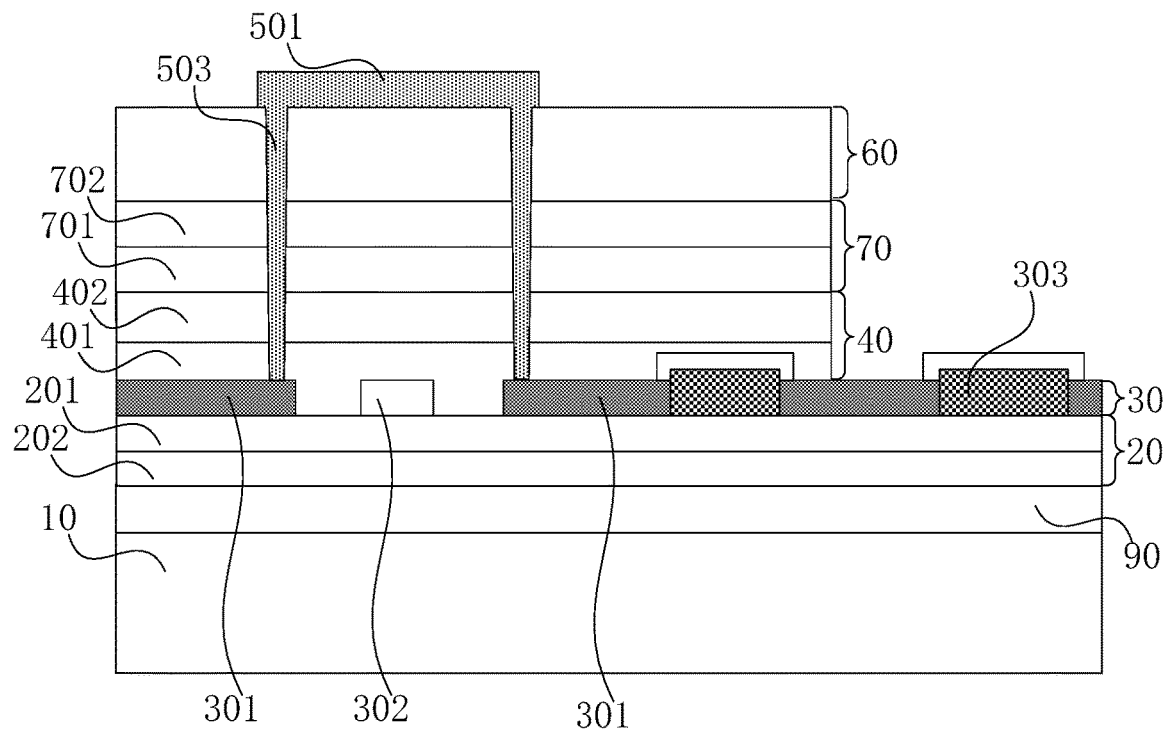
FIG. 13 illustrates a cross-sectional view of a touch module according to another embodiment of the present disclosure.

In some embodiments, as shown in FIG. 13, FIG. 13 illustrates a cross-sectional view of a touch module according to another embodiment of the present disclosure. The touch module includes a first optical adjustment layer 90 located between the substrate 10 and the first shadow elimination layer 20. Optionally, a material of the first optical adjustment layer 90 is silicon oxide or silicon nitride, etc. A thickness of the first optical adjustment layer 90 ranges from 200 angstroms to 1000 angstroms.

Figure 14:
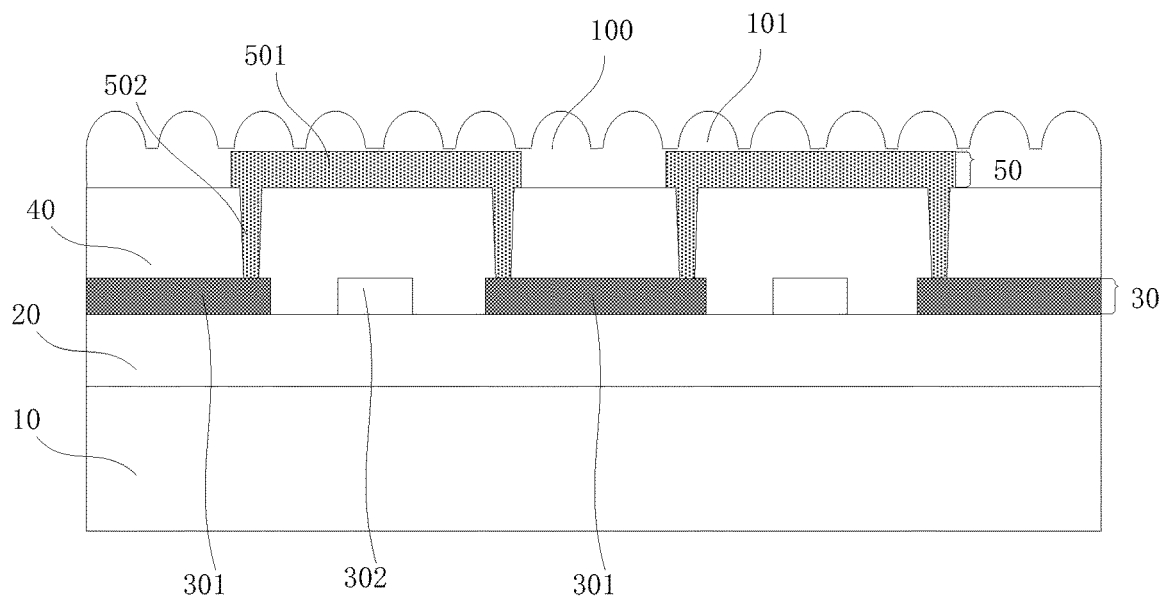
FIG. 14 illustrates a cross-sectional view of a touch module according to another embodiment of the present disclosure.

In some embodiments, as shown in FIG. 14, FIG. 14 illustrates a cross-sectional view of a touch module according to another embodiment of the present disclosure. The touch module further includes a second optical adjustment layer 100 located on a surface of the bridge layer 50 facing away from the second shadow elimination layer 40. A surface of the second optical adjustment layer 100 facing away from the bridge layer 50 includes a plurality of first micro-protrusion structures 101. The bridge layer 50 can be covered and protected by the second optical adjustment layer 100 to prevent the bridge layer 50 from being scratched and damaged. In addition, since the surface of the second optical adjustment layer 100 has the plurality of first micro-protrusions 101, reflected lights can be diffusely reflected, and transmitted lights can be scattered and refracted, so that light distributions in different areas are more uniform, thereby reducing a difference between the touch electrodes and areas other than the touch electrodes, reducing a visibility of the touch electrodes, better realizing an elimination of a pattern of the touch electrodes, and making the pattern of the touch electrodes more difficult to be perceived by human eyes.

Figure 15:
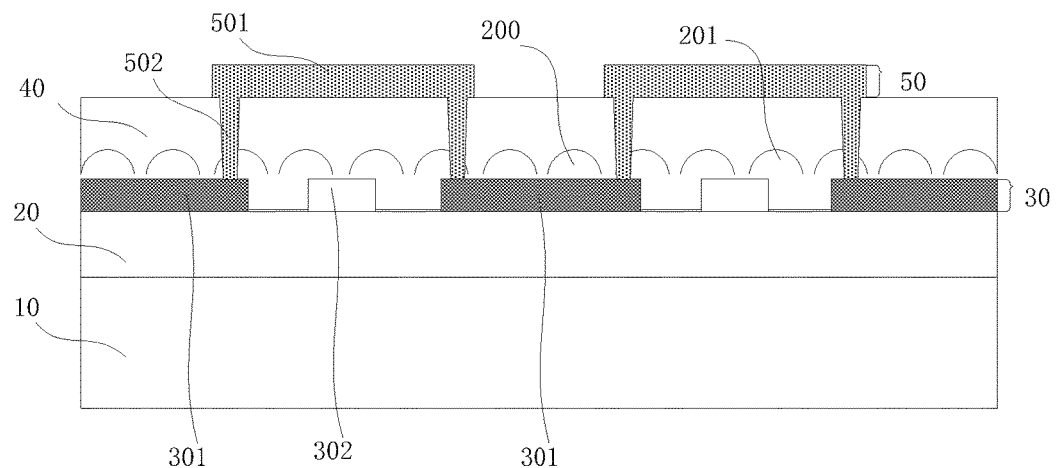
FIG. 15 illustrates a cross-sectional view of a touch module according to another embodiment of the present disclosure.

In some embodiments, as shown in FIG. 15, FIG. 15 illustrates a cross-sectional view of a touch module according to another embodiment of the present disclosure. The touch module further includes a third optical adjustment layer 200 located between the touch electrode layer 30 and the second shadow elimination layer 40. A surface of the third optical adjustment layer 200 facing away from the touch electrode layer 30 includes a plurality of second micro-protrusion structures 201. Since the surface of the third optical adjustment layer 200 has the plurality of second micro-protrusions 201, reflected lights can be diffusely reflected, and transmitted lights can be scattered and refracted, so that light distributions in different areas are more uniform, thereby reducing a difference between the touch electrodes and areas other than the touch electrodes, reducing a visibility of the touch electrode, better realizing an elimination of a pattern of the touch electrodes, and making the pattern of the touch electrodes more difficult to be perceived by human eyes. In addition, the third optical adjustment layer 200 and the second shadow elimination layer 40 can increase a thickness of a dielectric layer between the touch electrode layer 30 and the bridge layer 50, reduce a capacitance between the touch electrode layer 30 and the bridge layer 50, avoid an influence of the capacitance on touch, and improve an accuracy of touch detection.

Figure 16:
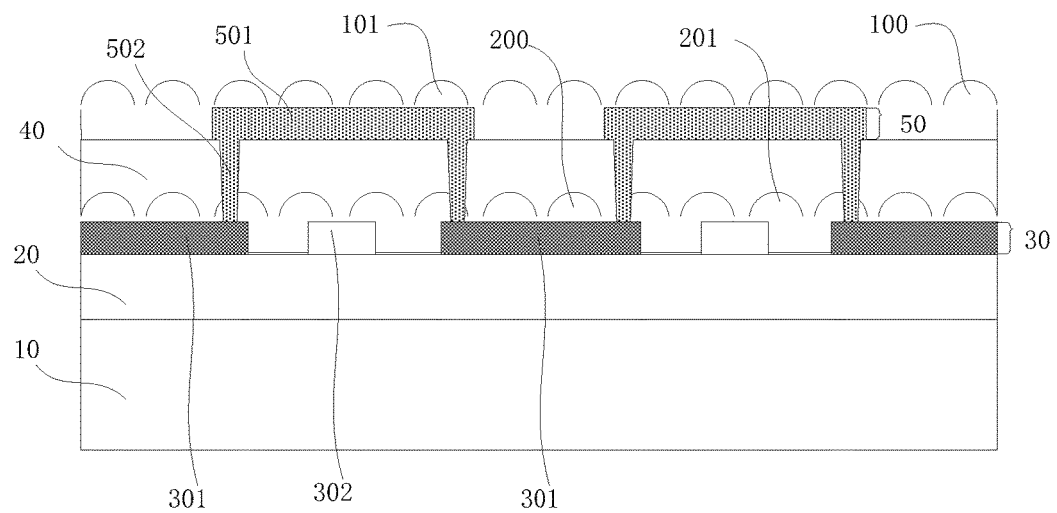
FIG. 16 illustrates a cross-sectional view of a touch module according to another embodiment of the present disclosure.

In some embodiments, as shown in FIG. 16, FIG. 16 illustrates a cross-sectional view of a touch module according to another embodiment of the present disclosure. The touch module further includes: a second optical adjustment layer 100 located on the surface of the bridge layer 50 facing away from the second shadow elimination layer 40, a surface of the second optical adjustment layer 100 facing away from the bridge layer 50 including a plurality of first micro-protrusion structures 101; and a third optical adjustment layer 200 located between the touch electrode layer 30 and the second shadow elimination layer 40. A surface of the third optical adjustment layer 200 facing away from the touch electrode layer 30 includes a plurality of second micro-protrusion structures 201. A manner shown in FIG. 16 provides the second optical adjustment layer 100 and the third optical adjustment layer 200 at a same time, which has advantages of manners shown in FIG. 14 and FIG. 15. The manner shown in FIG. 16 can not only protect the bridge layer 50, but also better realize an elimination of a pattern of the touch electrodes. The manner shown in FIG. 16 can also reduce a capacitance between the touch electrode layer 30 and the bridge layer 50 and improve an accuracy of a touch detection.

The second optical adjustment layer 100 and the third optical adjustment layer 200 may be over coating layers. The micro-protrusion structures on surfaces of the second optical adjustment layer 100 and the third optical adjustment layer 200 can cause reflected lights to form diffuse reflections and make transmitted lights scattered and refracted, so that light distributions in different areas are more uniform. A shape of the micro-protrusion structures on surfaces of the second optical adjustment layer 100 and the third optical adjustment layer 200 may be designed based on requirements. Widths of the first micro-protrusion structure 101 and the second micro-protrusion structure 201 are smaller than a size of the touch electrode. The size of the touch electrode is generally 8 μm, so the widths of the first micro-protrusion structure 101 and the second micro-protrusion structure 201 are less than 8 μm.

When the second optical adjustment layer 100 is provided, as shown in FIG. 14 and FIG. 16, a surface of the first micro-protrusion structure 101 is a smooth curved surface. A cut surface of the first micro-protrusion structure 101 is partially elliptical or partially round.

When the third optical adjustment layer 200 is provided, as shown in FIG. 15 and FIG. 16, a surface of the second micro-protrusion structure 201 is a smooth curved surface. A cut surface of the second micro-protrusion structure 201 is partially elliptical or partially round.

Figure 17:
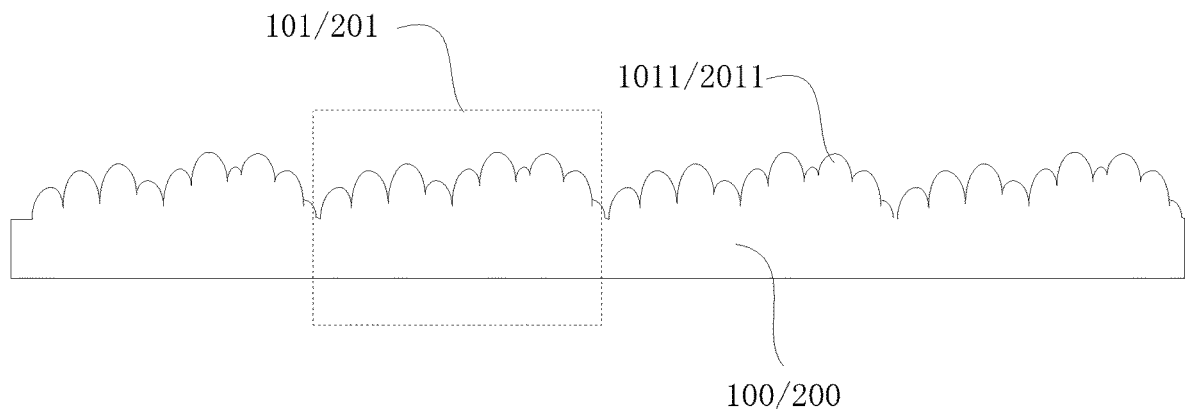
FIG. 17 illustrates a schematic diagram of a microprotrusion structure according to an embodiment of the present disclosure.

As shown in FIG. 17, FIG. 17 illustrates a schematic diagram of a micro-protrusion structure according to an embodiment of the present disclosure. When the second optical adjustment layer 100 is provided, the first micro-protrusion structure 101 includes a plurality of first sub-protrusion structures 1011. In a same first micro-protrusion structure 101, heights of at least two first sub-protrusion structures 1011 are different. A height of the first sub-protruding structure 1011 is a height of the top of the first sub-protruding structure 1011 relative to a bottom surface of the second optical adjustment layer 100. When the third optical adjustment layer 200 is provided, as shown in FIG. 17, the second micro-protrusion structure 201 includes a plurality of second sub-protrusion structures 2011. In a same second micro-protrusion structure 201, at least two heights of the two sub-protrusions 2011 are different.

Figure 18:
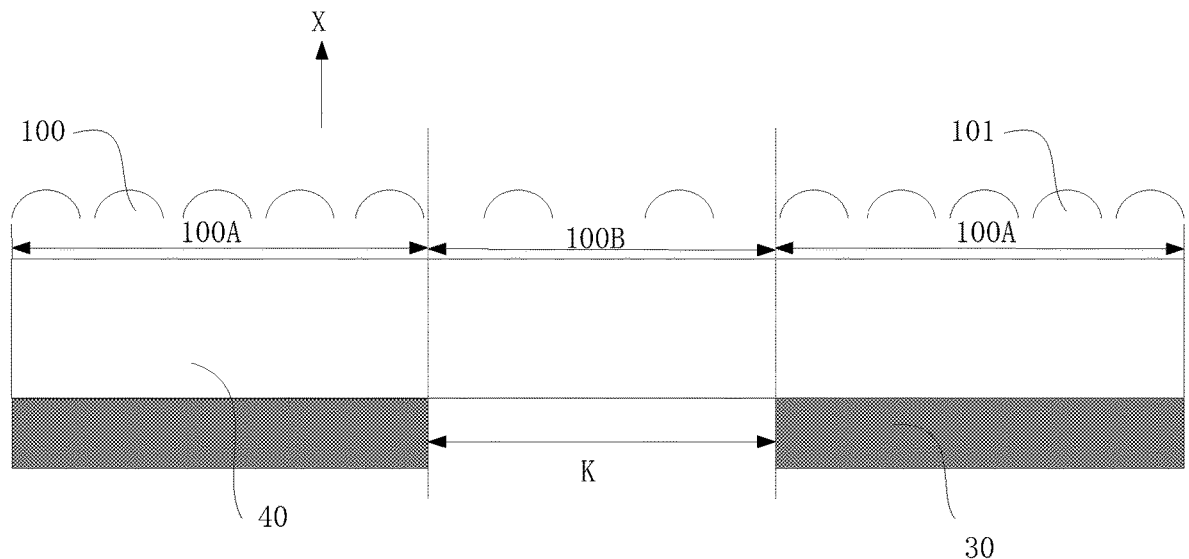
FIG. 18 illustrates a schematic diagram of a microprotrusion structure according to another embodiment of the present disclosure.

As shown in FIG. 18, FIG. 18 illustrates a schematic diagram of a micro-protrusion structure according to an embodiment of the present disclosure. The touch electrode layer 30 has a slit K. When the second optical adjustment layer 100 is provided, in the direction X perpendicular to the substrate, the second optical adjustment layer 100 has a first portion 100A overlapping the touch electrodes and a second portion 100B overlapping the slit K. A distribution density of the first micro-protrusion structures 101 (number of the first micro-protrusion structures 101 per unit area) in the first portion 100A is greater than a distribution density of the first micro-protrusion structures 101 in the second portion 100B. In a manner shown in FIG. 18, the first micro-protrusion structures 101 have a same structure and have a same radius of curvature.

In the manner shown in FIG. 18, setting the distribution density of the first micro-protrusions 101 in the first portion 100A of the touch electrodes to be greater than the distribution density of the first micro-protrusions 101 in the second portion 100B of the touch electrodes can make a light scattering effect of an area with the touch electrodes greater, make a light distribution in the area more uniform, and reduce a light brightness of an area corresponding to the slit K, thereby better realizing a shadow elimination effect. The slit K area without the touch electrodes has a weak reflection effect and a low light intensity.

Figure 19:
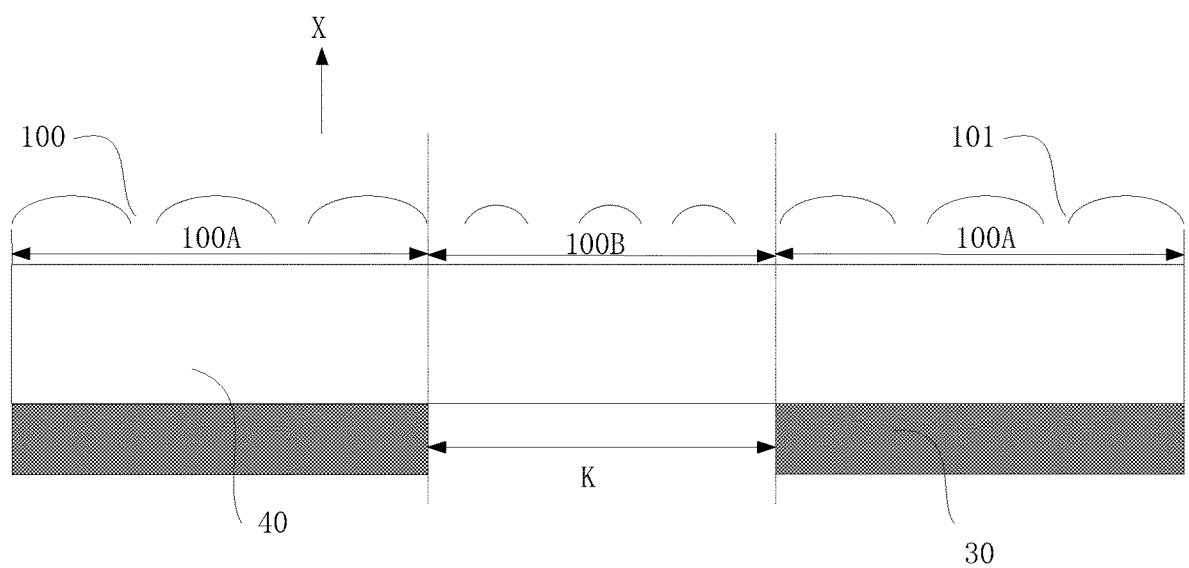
FIG. 19 illustrates a schematic diagram of a microprotrusion structure according to another embodiment of the present disclosure.

As shown in FIG. 19, FIG. 19 illustrates a schematic diagram of a micro-protrusion structure according to an embodiment of the present disclosure. A manner shown in FIG. 19 is different from the manner shown in FIG. 18 in that a radius of curvature of the first micro-protrusion structure 101 in the first portion 100A is set to be greater than a radius of curvature of the first micro-protrusion structure 101 in the second portion 100B, that is, a surface unevenness of the first area 100A is greater than a surface unevenness of the second portion 100B. In the manner shown in FIG. 19, a distribution density of the first micro-protrusions 101 in the first portion 100A is equal to a distribution density of the first micro-protrusions 101 in the second portion 100B.

In the manner shown in FIG. 19, setting a radius of curvature of the first micro-protrusion structure 101 in the first portion 100A to be greater than a radius of curvature of the first micro-protrusion structure 101 in the second portion 100B can make a deflection greater with respect to the direction X when a light in the area with the touch electrodes is reflected by the first micro-protrusion structure 101, make a light distribution in the area with the touch electrodes more uniform, and reduce a light brightness of the area corresponding to the slit K, thereby better realizing a shadow elimination effect.

Figure 20:
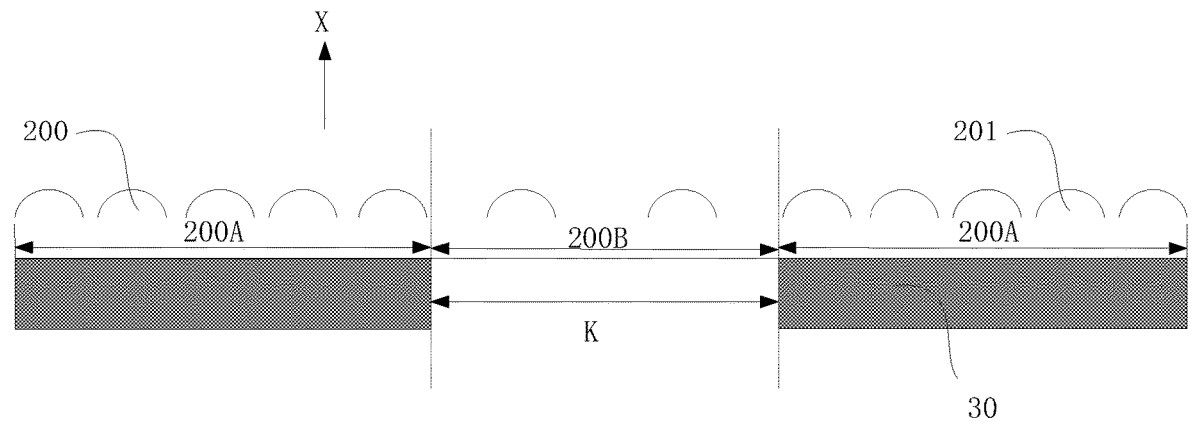
FIG. 20 illustrates a schematic diagram of a microprotrusion structure according to another embodiment of the present disclosure.

As shown in FIG. 20, FIG. 20 illustrates a schematic diagram of a micro-protrusion structure according to an embodiment of the present disclosure. The touch electrode layer 30 has the slit K. When the third optical adjustment layer 200 is provided, in the direction X perpendicular to the substrate, the third optical adjustment layer 200 has a third portion 200A overlapping the touch electrodes and a fourth portion 200B overlapping the slit K. A distribution density of the second micro-protrusions 201 in the third portion 200A is greater than a distribution density of the second micro-protrusions 201 in the fourth portion 200B. In the manner shown in FIG. 20, the second micro-protrusions 201 have a same structure and have a same radius of curvature.

In the manner shown in FIG. 20, setting a radius of curvature of the second micro-protrusion structure 201 in the third portion 200A to be greater than a radius of curvature of the second micro-protrusion structure 201 in the fourth portion 200B can make the area with touch electrodes have a greater light scattering effect, make a light distribution in the area more uniform, and reduce a light brightness of the area corresponding to the slit K, thereby better realizing a shadow elimination effect.

Figure 21:
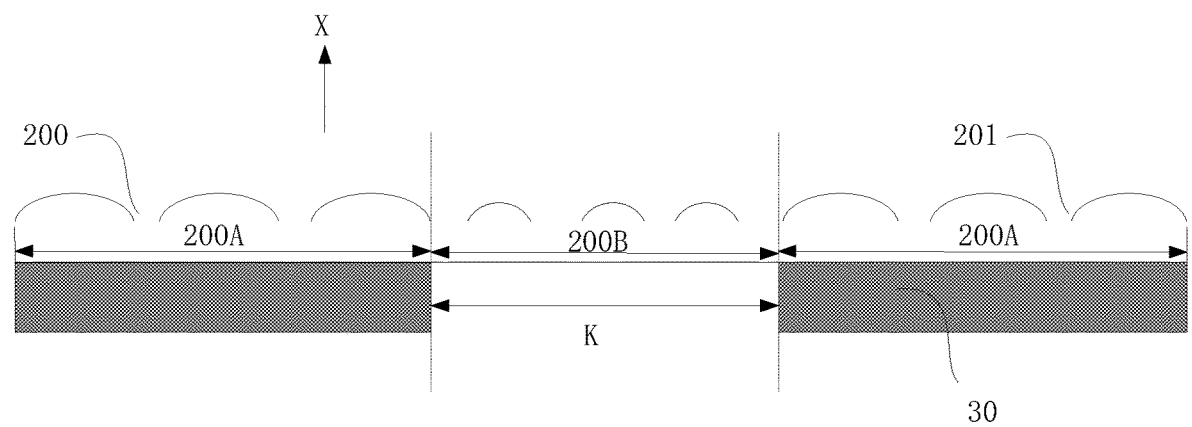
FIG. 21 illustrates a schematic diagram of a microprotrusion structure according to another embodiment of the present disclosure.

As shown in FIG. 21, FIG. 21 illustrates a schematic diagram of a micro-protrusion structure according to an embodiment of the present disclosure. A manner shown in FIG. 21 is different from the manner shown in FIG. 20 in that a radius of curvature of the second micro-protrusion structure 201 in the third portion 200A is set to be greater than a radius of curvature of the second micro-protrusion structure 201 in the fourth portion 200B, that is, a surface unevenness of the third portion 200A is greater than a surface unevenness of the fourth portion 200B. In the manner shown in FIG. 21, a distribution density of the second micro-protrusions 201 in the third portion 200A is equal to a distribution density of the second micro-protrusions 201 in the fourth portion 200B.

In the manner shown in FIG. 21, setting a radius of curvature of the second micro-protrusion structure 201 in the third portion 200A to be greater than a radius of curvature of the second micro-protrusion structure 201 in the fourth portion 200B can make a deflection greater with respect to the direction X when a light in the area with the touch electrode is reflected by the second micro-protrusion structure 201, make a light distribution in the area more uniform, and reduce a light brightness of the area corresponding to the slit K, thereby better realizing a shadow elimination effect.

Figure 22:
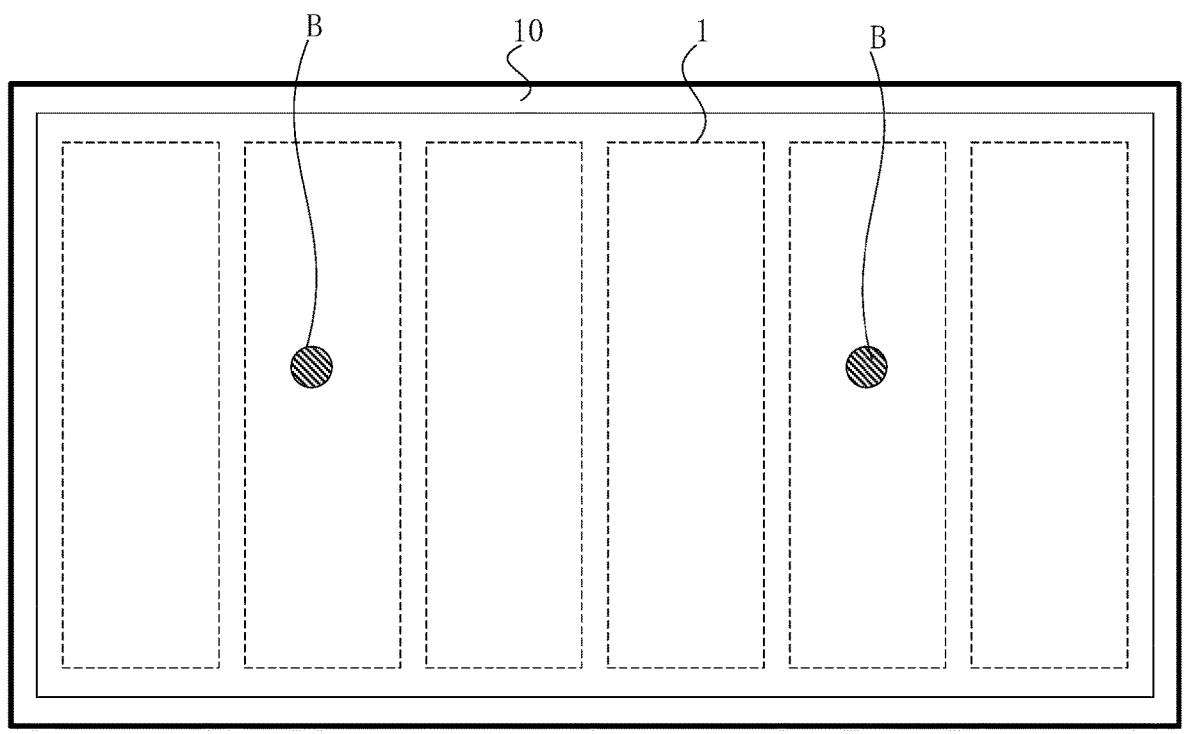
FIG. 22 illustrates a top view of multiple touch modules made of a large sheet of glass according to an embodiment of the present disclosure.

As shown in FIG. 22, FIG. 22 illustrates a top view of a multiple touch modules made of a large sheet of glass. When forming the first shadow elimination layer 20 and other CVD film layers on the large sheet of glass, i.e., substrate 10, through a CVD process, a pin needle is needed to push the large sheet of glass at point B. The pin needle supports the large sheet of glass as it descends and raises a heating stage, so that the large sheet of glass is gradually heated up during preheating. The pin needle and the large sheet of glass contact each other so that the large sheet of glass is further heated to a set temperature, and a relevant CVD gas is filled into the large sheet of glass to form a film.

Since the heating stage is vacant in the pin needle area, the pin needle area heats up more slowly than a non-pin needle area when the large sheet of glass contacts the heating stage and is finally heated to the set temperature, thereby resulting in a temperature difference between the pin area and the non-pin area. In a subsequent film formation stage, film qualities of a generated CVD film are different due to different temperatures on the substrate, which is finally manifested as a difference in reflected lights of the pin area and the non-pin area, forming a pinpoint dark area. Based on the above phenomenon, in some embodiments, a first optical adjustment layer 90 is formed between the substrate 10 and the first shadow elimination layer 20, so that the first optical adjustment layer 90 can effectively reduce a spectral gap of the reflected lights of the pin area and the non-pin area, thereby reducing the difference in the reflected light of the pin area and the non-pin area and making a difference in reflected lights of the entire touch module tend to be same.

Figure 23:
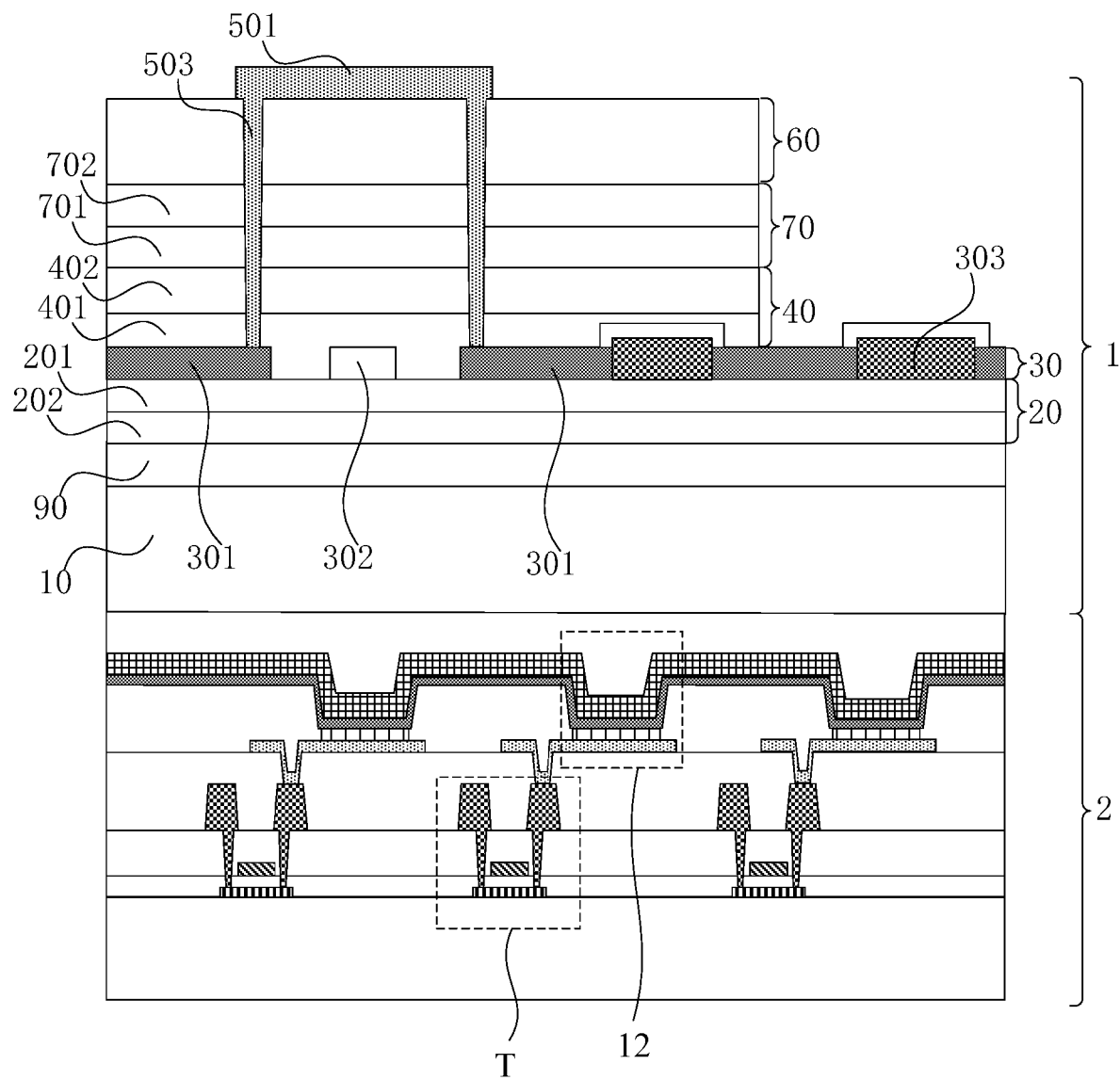
FIG. 23 illustrates a cross-sectional view of a touch display panel according to an embodiment of the present disclosure.

In one embodiment, a touch display panel is provided. The touch display panel includes a display module and the touch module provided by any of the above embodiments. As shown in FIG. 23, FIG. 23 illustrates a cross-sectional view of a touch display panel according to an embodiment of the present disclosure. The touch module 1 is located on a light emitting side of the display module 2.

The display module 2 may be a liquid crystal display panel, an LED display panel, or an OLED display panel, etc. In FIG. 23, the display module 2 is taken as an OLED display panel as an example for illustration. The display module 2 includes a driving transistor T and an OLED light-emitting unit 12, etc.

It should be noted that a refractive index of the touch electrode layer 30 in the touch module 1 is greater than a refractive index of a shadow elimination layer. That is, the refractive index of the touch electrode layer 30 is greater than a refractive index of the first, second, and third shadow elimination layers 20, 40, and 70, so that shadow elimination layers reduce a reflectivity of the touch module 1 and eliminates an image of a pattern of touch electrodes in the touch module 1.

Figure 24:
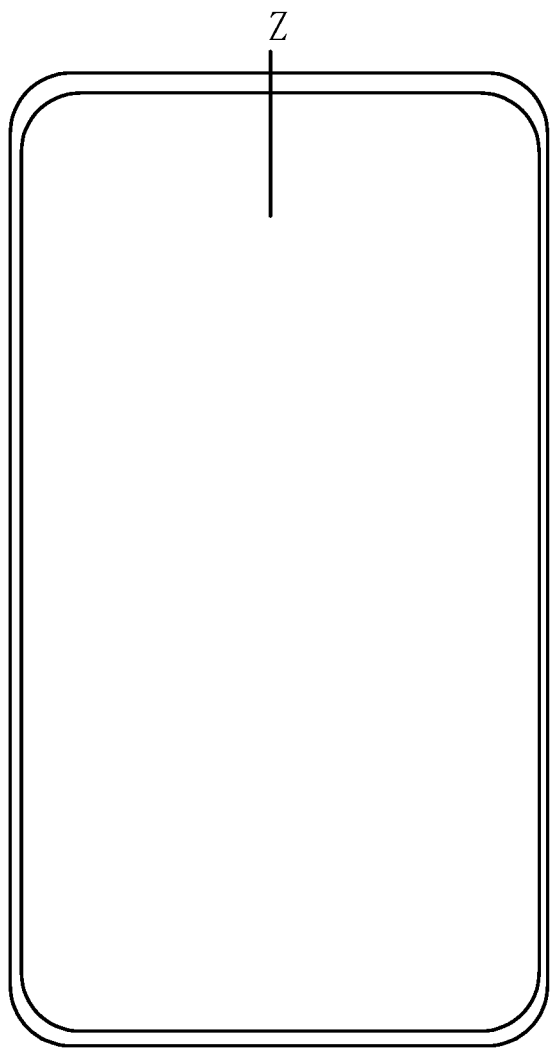
FIG. 24 illustrates a schematic diagram of a display device according to an embodiment of the present disclosure.
Figure 25:
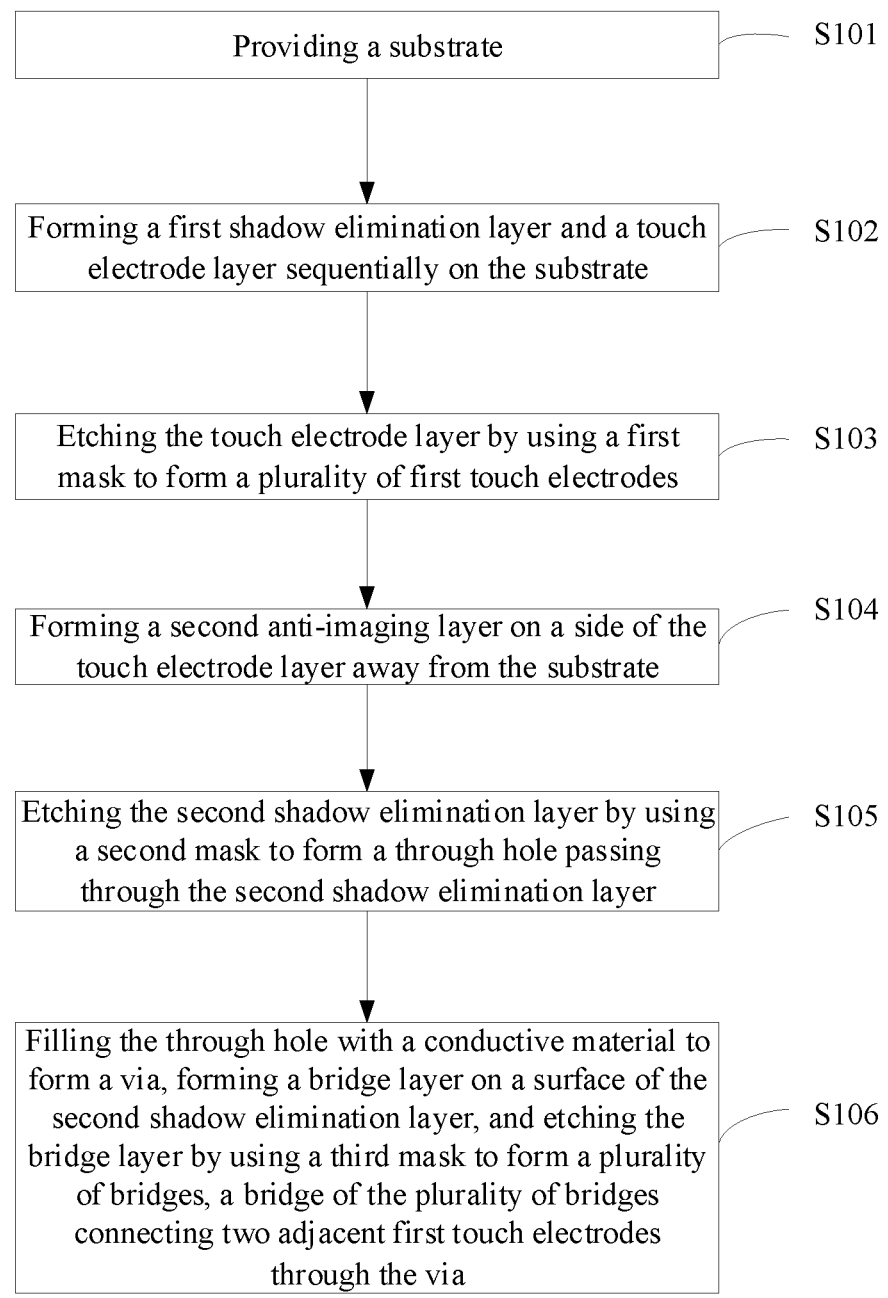
FIG. 25 illustrates a flow chart of a method of forming a touch module according to an embodiment of the present disclosure.

In one embodiment, a touch display device is provided. The touch display device includes the touch display panel provided in any of the above embodiments. As shown in FIG. 24, FIG. 24 illustrates a schematic diagram of a display device according to an embodiment of the present disclosure. The display device Z includes, but is not limited to, a full-screen mobile phone, a tablet, a digital camera, etc.

In one embodiment, a method of forming a touch module is provided. The method includes following steps.

S101: providing a substrate.

In some embodiments, referring to FIG. 2, the substrate 10 is provided first. Optionally, the substrate 10 is a transparent glass substrate, which is not limited herein.

S102: forming a first shadow elimination layer and a touch electrode layer sequentially on the substrate.

Specifically, the first shadow elimination layer 20 is formed on the substrate 10. Optionally, the first shadow elimination layer 20 can be formed by a CVD process or the like. The touch electrode layer 30 is formed on a surface of the first shadow elimination layer 20.

S103: etching the touch electrode layer by using a first mask to form a plurality of first touch electrodes.

The first mask is covered on the first shadow elimination layer 30. The first mask exposes the slits between the touch electrodes. The touch electrode layer 30 is etched by using an etching solution or the like to form the first touch electrode 301 and the second touch electrode 302.

S104: forming a second shadow elimination layer on a side of the touch electrode layer away from the substrate.

After the touch electrode layer 30 is etched, the second shadow elimination layer 40 is formed on a side of the touch electrode layer 30 away from the substrate 10. Similarly, a CVD process or the like can be used to form the second shadow elimination layer 40.

S105: etching the second shadow elimination layer by using a second mask to form a through hole passing through the second shadow elimination layer.

The second mask is covered on the second shadow elimination layer 40. The second mask exposes an area where a through hole is located. The second shadow elimination layer 40 is etched by using an etching solution or the like to form the through hole passing through the second shadow elimination layer 40.

S106: filling the through hole with a conductive material to form a via, forming a bridge layer on a surface of the second shadow elimination layer, and etching the bridge layer by using a third mask to form a plurality of bridges, a bridge of the plurality of bridges connecting two adjacent first touch electrodes through the via. The conductive material can be filled in the through hole by depositing an ITO material into the through hole.

After the through hole is formed, the bridge layer 50 is formed on a surface of the second shadow elimination layer 40. The third mask is used to etch the bridge layer 50 to form a plurality of bridging 501. That is, the bridge layer 50 includes the plurality of bridges 501. The conductive material forming the bridge layer 50 is simultaneously filled in the through hole to form the via 502 so that the bridge 501 connects two adjacent first touch electrodes 301 through the via 502.

In other embodiments, referring to FIG. 5, after etching the touch electrode layer by using the first mask to form the plurality of first touch electrodes, the method includes following steps.

On a side of the touch electrode layer 30 far away from the substrate 10, a second shadow elimination layer 40 and an insulating layer 60 are sequentially formed, that is, after the second shadow elimination layer 40 is formed, the insulating layer 60 can be deposited to reduce a capacitance.

The second mask is used to etch the second shadow elimination layer 40 and the insulating layer 60 to form a through hole passing through the second shadow elimination layer 40 and the insulating layer 60.

The conductive material is filled in the through hole to form the via 503, and the bridge layer 50 is formed on a surface of the insulating layer 60. The third mask is used to etch the bridge layer 50 to form a plurality of the bridges 501, and the bridge 501 connects two adjacent first touch electrodes 301 through the via 503.

Based on the above steps, in some embodiments, referring to FIG. 11, both the second shadow elimination layer 40 and the insulating layer 60 include a step area T. Etching the insulating layer 40 and the second shadow elimination layer 60 also includes a following step.

The second shadow elimination layer 40 and the insulating layer 60 are etched to form a step area T. The step area T exposes the connection terminal 303 in the touch electrode layer 30 so that the connection terminal 303 is connected to an external circuit.

Since both the second shadow elimination layer 40 and the insulating layer 60 need to be etched to form the via 503, and both need to be etched to form the step area T, therefore, in some embodiments, the second shadow elimination layer 40 and the insulating layer 60 share a same mask, which not only simplifies a process flow and shorten a process time, but also reduce one masks, thereby reducing a forming cost.

The various embodiments in the specification are described in a progressive, or parallel, or a combination of progressive and parallel. Each embodiment focuses on differences from other embodiments. Same and similar parts between the various embodiments can be referred to each other. Since the touch display panel, the touch display device, and the forming method disclosed in the embodiments correspond to the touch module disclosed in the embodiments of the present disclosure, the description of the touch display panel, the touch display device, and the forming method is relatively simple. For related information, please refer to a description of a corresponding part of the touch module.

The above description of the disclosed embodiments enables those skilled in the art to implement or use the present disclosure. Various modifications to these embodiments will be obvious to those skilled in the art. General principles defined herein can be implemented in other embodiments without departing from the spirit or scope of the present disclosure. Therefore, the present disclosure is not limited to the embodiments shown in the specification but should conform to a widest scope consistent with the principles and novel features disclosed in the specification.

What is claimed is:

1. A touch module, comprising:
a substrate; and
a first shadow elimination layer, a touch electrode layer, a second shadow elimination layer, and a bridge layer that are sequentially located on a side of the substrate, wherein
the touch electrode layer includes a plurality of first touch electrodes;
the bridge layer includes a plurality of bridges, and a bridge of the plurality of bridges connecting two adjacent first touch electrodes through a via passing through the second shadow elimination layer; and
a refractive index of the touch electrode layer in the touch module is greater than a refractive index of the first shadow elimination layer and a refractive index of the second shadow elimination layer, so that a first reflective interface is pie derated between the first shadow elimination layer and the touch electrode layer and a second reflective interface is generated between the touch electrode layer and the second shadow elimination layer.

2. The touch module according to claim 1, further comprising:
an insulating layer;
the insulating layer being located between the second shadow elimination layer and bridge layer; and
the bridge connecting the two adjacent first touch electrodes through a via passing through the second shadow elimination layer and the insulating layer.

3. The touch module according to claim 1, wherein:
the first shadow elimination layer includes at least one first sub-shadow-elimination-layer and at least one second sub-shadow-elimination-layer;
a refractive index of the first sub-shadow-elimination-layer is smaller than a refractive index of the second sub-shadow-elimination-layer; and
the first sub-shadow-elimination-layer and the second sub-shadow-elimination-layer are alternately arranged in a direction perpendicular to the substrate, and the first sub-shadow-elimination-layer is located between the touch electrode layer and the second sub-shadow-elimination-layer.

4. The touch module according to claim 3, wherein:
a material of the first sub-shadow-elimination-layer includes silicon oxide;
a material of the second sub-shadow-elimination-layer includes silicon nitride;
a thickness of the first sub-shadow-elimination-layer ranges from 250 angstroms to 300 angstroms; and
a thickness of the second sub-shadow-elimination-layer ranges from 250 angstroms to 300 angstroms.

5. The touch module according to claim 1, wherein:
the second shadow elimination layer includes at least one third sub-shadow-elimination-layer and at least one fourth sub-shadow-elimination-layer;
a refractive index of the third sub-shadow-elimination-layer is smaller than a refractive index of the fourth sub-shadow-elimination-layer; and
the third sub-shadow-elimination-layer and the fourth sub-shadow-elimination-layer are alternately arranged in the direction perpendicular to the substrate, and the third sub-shadow-elimination-layer is located between the touch electrode layer and the fourth sub-shadow-elimination-layer.

6. The touch module according to claim 5, wherein:
a material of the third sub-shadow-elimination-layer includes silicon oxide;
a material of the fourth sub-shadow-elimination-layer includes silicon nitride;
a thickness of the third sub-shadow-elimination-layer ranges from 250 angstroms to 300 angstroms; and
a thickness of the fourth sub-shadow-elimination-layer ranges from 250 angstroms to 430 angstroms.

7. The touch module according to claim 1, further comprising:
at least one third shadow elimination layer;
the at least one third shadow elimination layer being located between the second shadow elimination layer and the bridge layer; and
a thickness of the third shadow elimination layer being greater than a thickness of the second shadow elimination layer.

8. The touch module according to claim 7, wherein:
the third shadow elimination layer includes at least one fifth sub-shadow-elimination-layer and at least one sixth sub-shadow-elimination-layer;
a refractive index of the fifth sub-shadow-elimination-layer is smaller than a refractive index of the sixth sub-shadow-elimination-layer; and
the fifth s b-shadow-elimination-layer and the sixth sub-shadow-elimination-layer are alternately arranged in the direction perpendicular to the substrate, and the fifth sub-shadow-elimination-layer is located between the touch electrode layer and the sixth sub-shadow-elimination-layer.

9. The touch module according to claim 8, wherein:
a material of the fifth sub-shadow-elimination-layer includes silicon oxide;
a material of the sixth sub-shadow-elimination-layer includes silicon nitride;
a thickness of the fifth sub-shadow-elimination-layer ranges from 450 angstroms to 550 angstroms; and
a thickness of the sixth sub-shadow-elimination-layer ranges from 230 angstroms to 270 angstroms.

10. The touch module according to claim 1, further comprising a fourth shadow elimination layer located on a side of the bridge layer away from the substrate.

11. The touch module according to claim 2, wherein:
the second shadow elimination layer and the insulating layer both include a step area exposing a connection terminal in the touch electrode layer for the connection terminal to connect to an external circuit; and
the second shadow elimination layer and the insulating layer share a same mask.

12. The touch module according to claim 2, wherein a material of the insulating layer is silicon oxide or an overcoat material.

13. The touch module according to claim 12, wherein a thickness of silicon oxide ranges from 3,000 angstrom to 4,000 angstroms, and a thickness of the overcoat material ranges from 12,500 angstroms to 20,000 angstroms.

14. The touch module according to claim 1, wherein a thickness of the touch electrode layer ranges from 500 angstroms to 1,350 angstroms.

15. The touch module according to claim 1, wherein a thickness of the touch electrode layer ranges front 900 angstroms to 1,200 angstroms, and a thickness of the bridge layer ranges from 1,100 angstroms to 1,350 angstroms.

16. The touch module according to claim 1, wherein:
the touch electrode layer also includes a plurality of second touch electrode strips;
the plurality of second touch electrode strips extend along a first direction, and are sequentially arranged along a second direction;
the second touch electrode strip includes a plurality of second touch electrodes integrally connected in the first direction;
the plurality of first touch electrodes is arranged in an array, and adjacent first touch electrodes in the second direction are sequentially connected through the bridge and the via; and
the first touch electrodes sequentially connected in the second direction constitute a first touch electrode strip, a plurality of the first touch electrode strips is sequentially arranged along the first direction, and the first touch electrode strip and the second touch electrode strip intersect with each other in an insulated manner.

17. The touch module according to claim 1, further comprising a first optical adjustment layer located between the substrate and the first shadow elimination layer.

18. The touch module according to claim 17, wherein:
a material of the first optical adjustment layer is silicon oxide or silicon nitride; and
a thickness of the first optical adjustment layer ranges from 200 angstroms to 1000 angstroms.

19. The touch module according to claim 1, further comprising:
a second optical adjustment layer located on a surface of the bridge layer facing away from the second shadow elimination layer, wherein a surface of the second optical adjustment layer facing away from the bridge layer includes a plurality of first micro-protrusion structures; and/or
a third optical adjustment layer being located between the touch electrode layer and the second shadow elimination layer, wherein a surface of the third optical adjustment layer facing away from the touch electrode layer includes a plurality of second micro-protrusion structures.

20. The touch module according to claim 19, wherein:
when the second optical adjustment layer is provided, a surface of the first micro-protrusion structure is a smooth curved surface, or the first micro-protrusion structure includes a plurality of first sub-protrusion structures, in a same first micro-protrusion structure, at least two of the first sub-protrusion structures have different heights; and
when the third optical adjustment layer is provided, a surface of the second micro-protrusion structure is a smooth curved surface, or the second micro-protrusion structure includes a plurality of second sub-protrusion structures, in a same second micro-protrusion structure, at least two of the second sub-protrusion structures have different heights.

21. The touch module according to claim 19, wherein:
the touch electrode layer has a slit;
when the second optical adjustment layer is provided, in the direction perpendicular to the substrate, the second optical adjustment layer has a first portion overlapping the touch electrodes and a second portion overlapping the slit;
a distribution density of the first micro-protrusion structures in the first portion is greater than a distribution density of the first micro-protrusion structures in the second portion; or a radius of curvature of the first micro-protrusion structures in the first portion is greater than a radius of curvature of the first micro-protrusion structures in the second portion;
when the third optical adjustment layer is provided, in the direction perpendicular to the substrate, the third optical adjustment layer has a third portion overlapping the touch electrodes and a fourth portion overlapping the slit; and
a distribution density of the second micro-protrusion structures in the third portion is greater than a distribution density of the second micro-protrusion structures in the fourth portion; or a radius of curvature of the second micro-protrusion structures in the third portion is greater than a radius of curvature of the second micro-protrusion structures in the fourth portion.

22. A touch display panel, comprising:
a display module, and
a touch module, comprising;
a substrate; and
a first shadow elimination laver, a touch electrode layer, a second shadow elimination layer, and a bridge layer that are sequentially located on a side of the substrate, wherein the touch electrode layer includes a plurality of first touch electrodes; and the bridge layer includes a plurality of bridges, and a bridge of the plurality of bridges connecting two adjacent first touch electrodes through a via passing through the second shadow elimination layer; wherein the touch module is located on a light emitting side of the display module; and
a refractive index of the touch electrode layer in the touch module is greater than a refractive index of the first shadow elimination layer and a refractive index of the second shadow elimination layer, so that a first reflective interface is generated between the first shadow elimination layer and the touch electrode layer and a second reflective interface is generated between the touch electrode layer and the second shadow elimination layer.

23. A touch display device, comprising a touch display panel comprising:
- a display module, and
- a touch module, comprising;
  - a substrate; and
  - a first shadow elimination layer, a touch electrode layer, a second shadow elimination layer, and a bridge layer that are sequentially located on a side of the substrate, wherein the touch electrode layer includes a plurality of first touch electrodes; and the bridge layer includes a plurality of bridges, and a bridge of the plurality of bridges connecting two adjacent first touch electrodes through a via passing through the second shadow elimination layer; wherein the touch module is located on a light emitting side of the display module; and
- a refractive index of the touch electrode layer in the touch module is greater than a refractive index of the first shadow elimination layer and a refractive index of the second shadow elimination layer, so that a first reflective interface is generated between the first shadow elimination layer and the touch electrode layer and a second reflective interface is generated between the touch electrode layer and the second shadow elimination layer.

* * * * *